(12) United States Patent
Lee

(10) Patent No.: US 12,477,902 B2
(45) Date of Patent: Nov. 18, 2025

(54) DISPLAY DEVICE COMPRISING DIVISION PATTERNS WITHIN LIGHT EMITTING AREAS

(71) Applicant: Samsung Display Co., Ltd., Yongin-si (KR)

(72) Inventor: Hyeonbum Lee, Hwaseong-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 550 days.

(21) Appl. No.: 17/831,378

(22) Filed: Jun. 2, 2022

(65) Prior Publication Data

US 2023/0044947 A1  Feb. 9, 2023

(30) Foreign Application Priority Data

Aug. 2, 2021 (KR) ........................ 10-2021-0101341

(51) Int. Cl.
*H10K 59/122* (2023.01)
*H10K 50/86* (2023.01)

(52) U.S. Cl.
CPC ......... *H10K 59/122* (2023.02); *H10K 50/865* (2023.02)

(58) Field of Classification Search
CPC .. H10K 59/352; H10K 59/353; H10K 59/351; H10K 59/35; H10K 59/122
See application file for complete search history.

(56) References Cited

U.S. PATENT DOCUMENTS

| | | | |
|---|---|---|---|
| 9,640,589 B2 * | 5/2017 | Wang | H10K 59/353 |
| 10,692,939 B2 | 6/2020 | Yang | |
| 2009/0195144 A1 * | 8/2009 | Kitabayashi | H10K 50/805 |
| | | | 313/503 |
| 2014/0197385 A1 * | 7/2014 | Madigan | H10K 59/353 |
| | | | 438/34 |
| 2018/0076270 A1 * | 3/2018 | Kwon | H10K 77/111 |
| 2018/0375057 A1 * | 12/2018 | Shin | H10K 59/80518 |
| 2020/0075699 A1 * | 3/2020 | Kim | H10K 59/878 |
| 2020/0365673 A1 * | 11/2020 | Kitabayashi | H10K 71/135 |

(Continued)

FOREIGN PATENT DOCUMENTS

| | | |
|---|---|---|
| CN | 111584576 A | 8/2020 |
| KR | 20160109611 A | 9/2016 |

(Continued)

*Primary Examiner* — Nduka E Ojeh
(74) *Attorney, Agent, or Firm* — Harness, Dickey & Pierce, P.L.C.

(57) ABSTRACT

A display device includes a circuit element layer including at least one transistor, a display element layer disposed on the circuit element layer and including a first area including first, second, and third light emitting areas and a first non-light-emitting area and a second area including fourth, fifth, and sixth areas and a second non-light-emitting area, a first light emitting element to provide a first light to each of the first light emitting area and the fourth light emitting area, a second light emitting element to provide a second light to each of the second light emitting area and the fifth emitting area, and a third light emitting element to provide a third light to each of the third light emitting area and the sixth emitting area, a pixel definition layer provided with openings, and a division pattern disposed in at least some of the openings.

19 Claims, 24 Drawing Sheets

(56) References Cited

U.S. PATENT DOCUMENTS

| | | | | |
|---|---|---|---|---|
| 2022/0278181 A1* | 9/2022 | Cui | ................... | H10K 59/122 |
| 2022/0415983 A1* | 12/2022 | Choi | ................... | H10K 59/353 |
| 2023/0098247 A1* | 3/2023 | Cui | ................... | H10K 59/353 |
| | | | | 257/40 |
| 2023/0131455 A1* | 4/2023 | Bing | ................... | H10K 59/353 |
| | | | | 257/89 |

FOREIGN PATENT DOCUMENTS

| | | |
|---|---|---|
| KR | 10-2018-0135342 | 12/2018 |
| KR | 10-2019-0072822 | 6/2019 |
| KR | 20190096472 A | 8/2019 |
| KR | 10-2162085 | 10/2020 |
| KR | 10-2021-0016230 | 2/2021 |

* cited by examiner

DISPLAY DEVICE COMPRISING DIVISION PATTERNS WITHIN LIGHT EMITTING AREAS

CROSS-REFERENCE TO RELATED APPLICATION

This application claims priority from and the benefit of Korean Patent Application No. 10-2021-0101341, filed on Aug. 2, 2021, which is hereby incorporated by reference for all purposes as if fully set forth herein.

BACKGROUND

Field

Embodiments of the invention relate generally to a display device and more specifically, to a display device having at least two operation modes.

DISCUSSION OF THE BACKGROUND

Electronic devices, such as smart phones, tablet computers, notebook computers, car navigation units, and smart televisions, have been developed. Electronic devices include a display device to provide information.

Users have been wanted the quality of images suitable to their usage environments. For instance, the users have been demanded a brighter image outside a building where the image is affected by natural light. In addition, when the users view personal information through electronic devices, the users have been demanded an image with a narrow viewing angle.

The above information disclosed in this Background section is only for understanding of the background of the inventive concepts, and, therefore, it may contain information that does not constitute prior art.

SUMMARY

Display devices constructed according to the principles of the invention are capable of providing users with a narrow viewing angle mode to protect their person information from being exposed and improving process reliability when pixel patterns are formed.

Additional features of the inventive concepts will be set forth in the description which follows, and in part will be apparent from the description, or may be learned by practice of the inventive concepts.

According to an aspect of the invention, a display device includes: a circuit element layer including at least one transistor; and a display element layer disposed on the circuit element layer, the display element layer including: a first area including first, second, and third light emitting areas and a first non-light emitting area; and a second area including fourth, fifth, and sixth light emitting areas and a second non-light emitting area, wherein the display element layer includes: a first light emitting element to provide a first light to each of the first light emitting area and the fourth light emitting area; a second light emitting element to provide a second light to each of the second light emitting area and the fifth emitting area; and a third light emitting element to provide a third light to each of the third light emitting area and the sixth emitting area; a pixel definition layer having openings defined therethrough to overlap the first, second, third, fourth, fifth, and sixth light emitting areas, respectively; and a first division pattern disposed in at least some of the openings, and wherein: each of the fourth, fifth, and sixth light emitting areas of the second area includes a plurality of sub-unit areas, the first division pattern overlaps the second area and divides each of the fourth, fifth, and sixth light emitting areas of the second area into the plurality of sub-unit areas, the second non-light-emitting area of the second area includes a first sub-non-light-emitting area surrounding the fourth, fifth, and sixth light emitting areas and a second sub-non-light-emitting area surrounded by the plurality of sub-unit areas of each of the fourth, fifth, and sixth light emitting areas and the first sub-non-light-emitting area, and the pixel definition layer overlaps the first non-light-emitting area of the first area and the first sub-non-light-emitting area of the second area and has a transmittance different from a transmittance of the first division pattern.

The pixel definition layer may include an organic layer including a light blocking material.

The second light emitting area may have a size greater than a size of the first light emitting area and smaller than a size of the third light emitting area in the first area, and the fifth light emitting area may have a size greater than a size of the fourth light emitting area and smaller than a size of the sixth light emitting area in the first area.

The plurality of sub-unit areas may include fourth sub-unit areas included in the fourth light emitting area, fifth sub-unit areas included in the fifth light emitting area, and sixth sub-unit areas included in the sixth light emitting area in the second area.

The fourth sub-unit areas may have a same width as each other in one direction in the second area, the fifth sub-unit areas have the same width as each other in the one direction in the second area, and the sixth sub-unit areas have the same width as each other in the one direction in the second area.

Each of the first, second, and third light emitting elements may include a first electrode, a second electrode disposed on the first electrode, and a light emitting layer disposed between the first electrode and the second electrode, each of the openings of the pixel definition layer may expose at least a portion of the first electrode, and the first division pattern may be disposed on the first electrode exposed through the openings.

Each of the first, second, and third light emitting areas of the first area may include a plurality of other sub-unit areas, the plurality of other sub-unit areas including first sub-unit areas included in the first light emitting area, second sub-unit areas included in the second light emitting area, and third sub-unit areas included in the third light emitting area.

The display device may further include a second division pattern overlapping the first area, disposed on the first electrode exposed through the openings, and including a same material as the first division pattern, wherein the first, second, and third sub-unit areas of the first area may be defined by the second division pattern.

The plurality of sub-unit areas may include fourth sub-unit areas included in the fourth light emitting area, fifth sub-unit areas included in the fifth light emitting area, and sixth sub-unit areas included in the sixth light emitting area in the second area, and wherein a sum of sizes of the first sub-unit areas of the first area may be substantially equal to a sum of sizes of the fourth sub-unit areas of the second area, a sum of sizes of the second sub-unit areas of the first area may be substantially equal to a sum of sizes of the fifth sub-unit areas of the second area, and a sum of sizes of the third sub-unit areas of the first area may be substantially equal to a sum of sizes of the sixth sub-unit areas of the second area.

The display device may further include: at least one insulating layer disposed on the display element layer; a first planarization layer disposed on the at least one insulating layer; a light blocking pattern disposed on the first planarization layer; and a second planarization layer disposed on the first planarization layer and covering the light blocking pattern, wherein the light blocking pattern may be disposed on the pixel definition layer and the first division pattern disposed in the second area and may not overlap the second division pattern in the first area.

The first non-light-emitting area may include a first peripheral area surrounding the first, second, and third light emitting areas, a first center area surrounded by the first, second, and third light emitting areas and the first peripheral area in the first area, and wherein the display element layer may further include a first center division pattern disposed to overlap the first center area and formed of a same material as the first division pattern in the first area.

The first sub-non-light-emitting area may include a second peripheral area surrounding the fourth, fifth, and sixth light emitting areas and a second center area surrounded by the fourth, fifth, and sixth light emitting areas and the second peripheral area in the second area, and wherein the display element layer may further include a second center division pattern disposed to overlap the second center area and formed of a same material as the first division pattern.

Each of the first, second, and third light emitting areas may include a plurality of other sub-unit areas in the first area, the display element layer may further include a second division pattern overlapping the first area and disposed on the first electrode exposed through the openings, and the plurality of other sub-unit areas of the first area may be defined by the second division pattern.

The display element layer may include a first support pattern disposed on the pixel definition layer and surrounded by the first, second, and third light emitting areas of the first area and a second support member disposed on the pixel definition layer and surrounded by the fourth, fifth, and sixth light emitting areas of the second area, and wherein the first and second support patterns and the first division pattern may include one of a polymer material and a silicon.

The first light emitting area may be provided in two in the first area, the two first light emitting areas may be arranged in a first direction, the second light emitting area and the third light emitting area may be spaced apart from each other in a second direction intersecting the first direction, the first support pattern may be disposed between the two first light emitting areas and is disposed between the second and third light emitting areas, and the fourth light emitting area may be provided in two in the second area, the two fourth light emitting areas may be arranged in the first direction, the fifth light emitting area and the sixth light emitting area may be spaced apart from each other in the second direction in the second area, and the second support pattern may be disposed between the two fourth light emitting areas and may be disposed between the fifth and sixth light emitting areas.

Each of the first and second support patterns may have a rectangular shape defined by first long sides extending in the first direction and first short sides extending in the second direction, the first long sides may have a length equal to or greater than about 5 micrometers and equal to or smaller than about 30 micrometers, and the first short sides may have a length equal to or greater than about 3 micrometers and equal to or smaller than about 20 micrometers.

The display element layer may further include a plurality of sub-support patterns, and wherein: one of the plurality of sub-support patterns may be disposed between the first light emitting area of the first area and the fourth light emitting area of the second area in the second direction and disposed between the third light emitting area of the first area and the fifth light emitting area of the second area in the first direction, and another of the plurality of sub-support patterns may be disposed between the first light emitting area of the first area and the fourth light emitting area of the second area in the second direction and disposed between the second light emitting area of the first area and the sixth light emitting area of the second area in the first direction.

Each of the plurality of sub-support patterns may have a rectangular shape defined by second long sides extending in the second direction and second short sides extending in the first direction, the second long sides may have a length equal to or greater than about 5 micrometers and equal to or smaller than about 30 micrometers, and the second short sides may have a length equal to or greater than about 3 micrometers and equal to or smaller than about 15 micrometers.

A separation distance from each of the first and second support patterns and the plurality of sub-support patterns to the first, second, third, fourth, fifth, and sixth light emitting areas most adjacent thereto may be equal to or greater than about 3 micrometers and equal to or smaller than about 15 micrometers.

In a first operation mode, the first, second, and third light emitting areas of the first area may be activated, and the fourth, fifth, and sixth light emitting areas of the second area may be activated, and in a second operation mode, the first, second, and third light emitting areas of the first area may be inactivated, and the fourth, fifth, and sixth light emitting areas of the second area may be activated.

According to the above, the pixel definition layer that defines light emitting areas respectively providing different color lights includes the light blocking material, and thus, the display device has a reduced reflectance.

The division pattern dividing each of the light emitting areas, which is activated in a private operation mode, into portions includes a material causing less process variation than that of the pixel definition layer in a patterning process. Thus, the process reliability of the display device is improved.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1A:
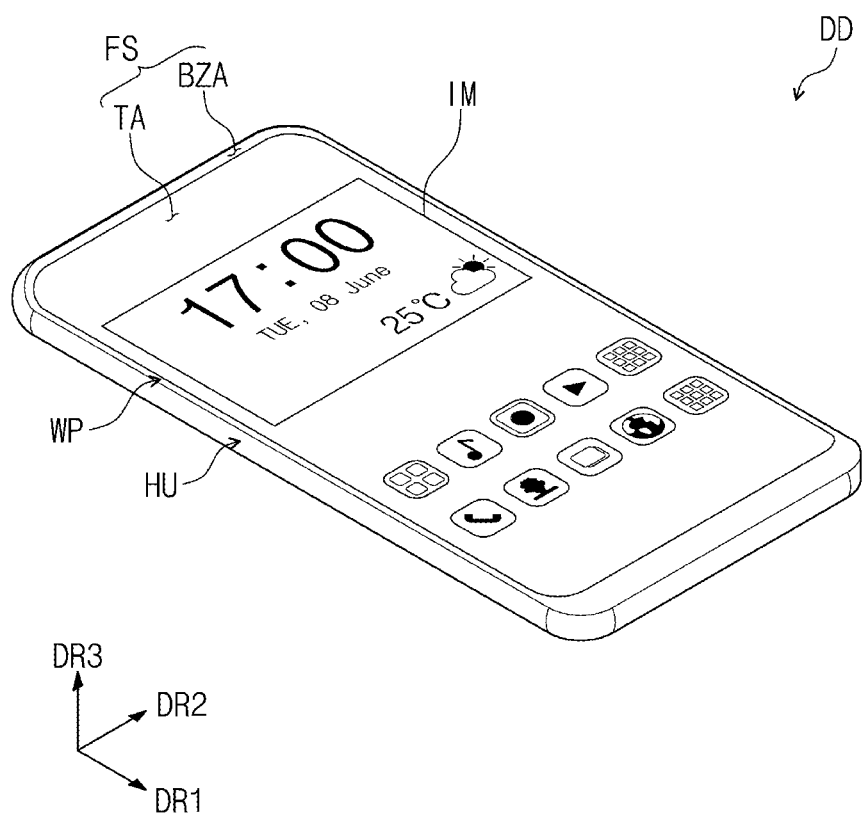
FIG. 1A is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments will be explained in detail with reference to the accompanying drawings.

Figure 1B:
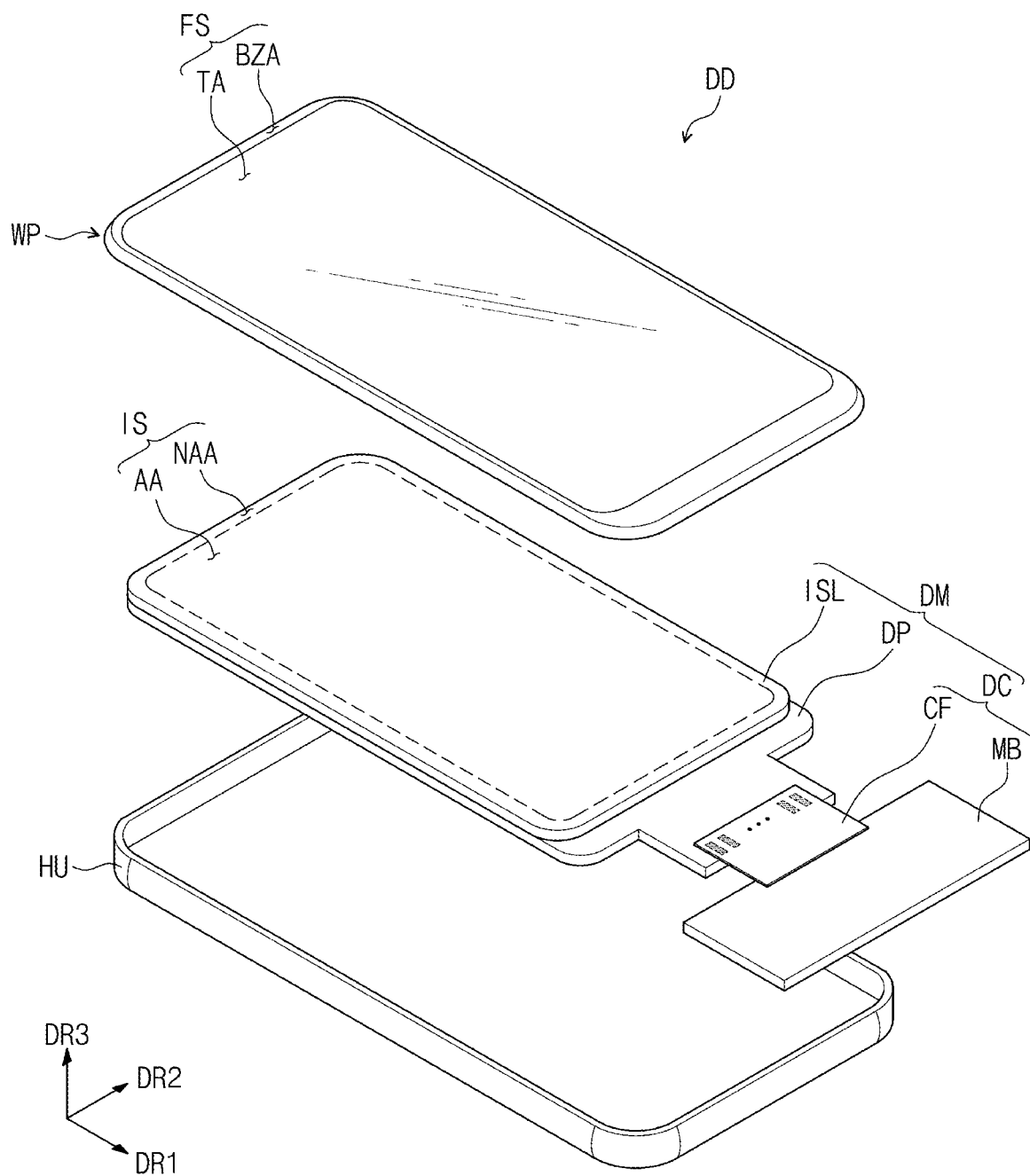
FIG. 1B is an exploded perspective view of the display device of FIG. 1A.
Figure 2A:
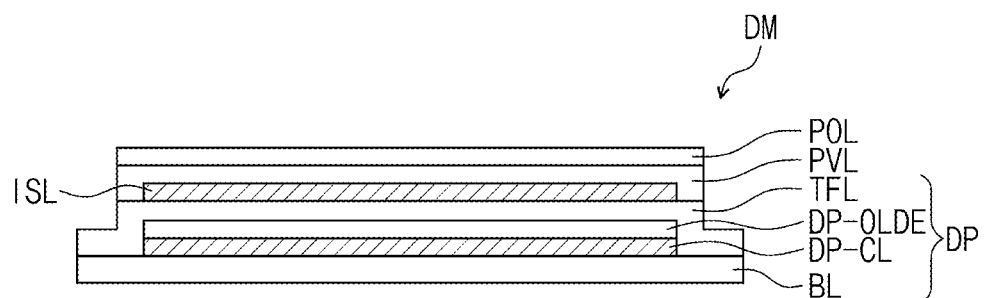
FIG. 2A is a cross-sectional view of an embodiment of a display module of FIG. 1B.
Figure 2A:
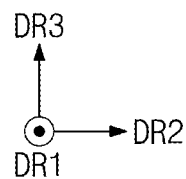
Figure 2B:
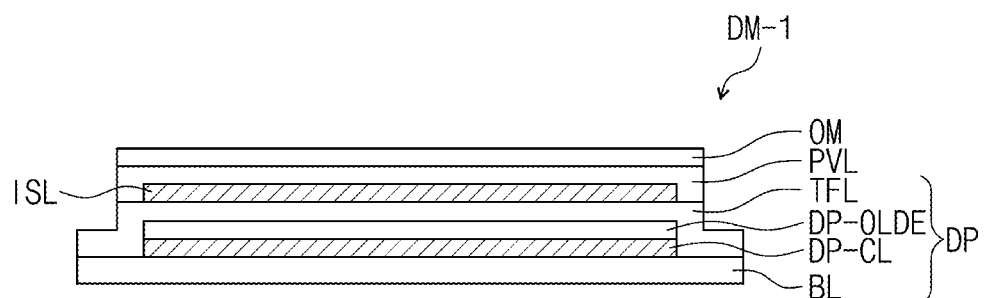
FIG. 2B is a cross-sectional view of another embodiment of the display module of FIG. 1B.
Figure 2B:
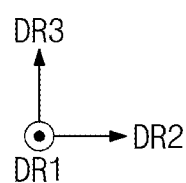

FIG. 1A is a perspective view showing a display device DD according to an embodiment. FIG. 1B is an exploded perspective view showing the display device DD according to an embodiment. FIG. 2A is a cross-sectional view showing a display module DM according to an embodiment. FIG. 2B is a cross-sectional view showing a display module DM-1 according to an embodiment.

Referring to FIG. 1A, the display device DD may be a device activated in response to an electrical signal. The display device DD may include various embodiments. For example, the display device DD may be applied to a large-sized electronic product, such as a television set, a monitor, or an outdoor billboard, and a small and medium-sized electronic product, such as a personal computer, a notebook computer, a personal digital assistant, a car navigation unit, a game unit, a mobile electronic device, and a camera. In an embodiment, a smartphone will be described as a representative example of the display device DD.

The display device DD may display an image IM through a display surface FS, which is substantially parallel to each of a first direction DR1 and a second direction DR2, toward a third direction DR3. The image IM may include a video and a still image. FIG. 1A shows a clock widget and application icons as a representative example of the image IM. The display surface FS through which the image IM is displayed may correspond to a front surface of the display device DD and a front surface of a window panel WP.

In an embodiment, front (e.g., upper) and rear (e.g., lower) surfaces of each member of the display device DD may be defined with respect to a direction in which the image IM is displayed. The front and rear surfaces may be opposite to each other in the third direction DR3, and a normal line direction of each of the front and rear surfaces may be substantially parallel to the third direction DR3. Meanwhile, directions indicated by the first, second, and third directions DR1, DR2, and DR3 may be relative to each other, and thus, the directions indicated by the first, second, and third directions DR1, DR2, and DR3 may be changed to other directions. In the following descriptions, the expression "when viewed in a plane" means a state of being viewed in the third direction DR3.

Referring to FIG. 1B, the display device DD may include the window panel WP, the display module DM, and a housing HU. In an embodiment, the window panel WP and the housing HU may be coupled to each other to form an exterior of the display device DD.

The window panel WP may include an optically transparent insulating material. For example, the window panel WP may include a glass or plastic material. The front surface of the window panel WP may define the display surface FS of the display device DD as described above. The display surface FS may include a transmissive area TA and a bezel area BZA. The transmissive area TA may be an optically transparent area. For example, the transmissive area TA may be an area having a visible light transmittance of about 90% or more.

The bezel area BZA may be an area having a relatively lower transmittance than that of the transmissive area TA. The bezel area BZA may define a shape of the transmissive area TA. The bezel area BZA may be disposed adjacent to the transmissive area TA and may surround the transmissive area TA. The bezel area BZA may cover a peripheral area NAA of the display module DM to prevent the peripheral area NAA from being viewed from the outside. However, this is merely one example, and the bezel area BZA may be omitted from the window panel WP according to the embodiment.

The display module DM may display the image IM and may sense an external input. The display module DM may include a front surface IS in which an active area AA and the peripheral area NAA are defined. The active area AA may be an area activated in response to an electrical signal.

In an embodiment, the active area AA may be an area through which the image IM is displayed and the external input is sensed. The transmissive area TA may overlap at least a portion of the active area AA. For example, the transmissive area TA may overlap an entire surface or at least a portion of the active area AA.

The peripheral area NAA may be covered by the bezel area BZA. The peripheral area NAA may be disposed adjacent to the active area AA. The peripheral area NAA may surround the active area AA. A driving circuit or a driving line to drive the active area AA may be disposed in the peripheral area NAA.

The display module DM may include a display panel DP, an input sensor ISL, and a driving circuit DC.

The display panel DP may include configurations to generate the image IM. The image IM generated by the display panel DP may be viewed from outside by the user through the transmissive area TA.

The input sensor ISL may sense the external input applied thereto from the outside. As described above, the input sensor ISL may sense the external input applied to the window panel WP. The external input may include a variety of inputs provided from the outside of the display device DD. As an example, the external inputs may include a proximity input (e.g., hovering) applied when approaching close to or adjacent to the display device DD at a predetermined distance as well as a touch input by a part of the user's body (e.g., the user's hand). In addition, the external inputs may be provided in the form of force, pressure, light, etc., however, embodiments are not limited thereto or thereby.

The driving circuit DC may be electrically connected to the display panel DP and the input sensor ISL. The driving circuit DC may include a main circuit board MB and a flexible circuit board CF.

The flexible circuit board CF may be electrically connected to the display panel DP. The flexible circuit board CF may connect the display panel DP to the main circuit board MB, however, this is merely one example. According to an embodiment, the flexible circuit board CF may not be connected to the main circuit board, and the flexible circuit board CF may be a rigid substrate.

The flexible circuit board CF may be connected to pads (e.g., display pads) of the display panel DP, which are disposed in the peripheral area NAA. The flexible circuit board CF may provide electrical signals to the display panel DP to drive the display panel DP. The electrical signals may be generated by the flexible circuit board CF or the main circuit board MB.

The main circuit board MB may include various driving circuits to drive the display module DM or a connector to supply power. The main circuit board MB may be connected to the display module DM via the flexible circuit board CF.

According to an embodiment, the display module DM may be easily controlled by using one main circuit board MB, however, this is merely one example. According to an embodiment, the display panel DP and the input sensor ISL may be connected to different main circuit boards.

The housing HU may be coupled to the window panel WP. The housing HU and the window panel WP coupled to the housing HU may provide a predetermined inner space. The display module DM may be accommodated in the inner space.

The housing HU may include a material with a relatively high rigidity. For example, the housing HU may include a glass, plastic, or metal material or a plurality of frames and/or plates of combinations thereof. The housing HU may protect the components of the display device DD accommodated in the inner space from external impacts.

Referring to FIG. 2, the display module DM may include the display panel DP, the input sensor ISL, a light blocking layer PVL, and an optical member POL.

The display panel DP may include a base layer BL, a circuit element layer DP-CL, a display element layer DP-OLED, and a thin film encapsulation layer TFL.

The display panel DP may include a plurality of insulating layers, a semiconductor pattern, a conductive pattern, and a signal line. An insulating layer, a semiconductor layer, and a conductive layer may be formed by a coating or depositing process. Then, the insulating layer, the semiconductor layer, and the conductive layer may be selectively patterned by a photolithography process and an etching process. The semiconductor pattern, the conductive pattern, and the signal line included in the circuit element layer DP-CL and the display element layer DP-OLED may be formed through the above processes.

The base layer BL may be used as a base layer on which the circuit element layer DP-CL, the display element layer DP-OLED, the thin film encapsulation layer TFL, and the input sensor ISL are stacked. The base layer BL may be flexible or rigid and may have a single-layer or multi-layer structure. However, embodiments are not limited thereto.

The circuit element layer DP-CL may be disposed on the base layer BL. The circuit element layer DP-CL may include a plurality of insulating layers, a plurality of conductive layers, and a semiconductor layer. The conductive layers of the circuit element layer DP-CL may form signal lines or a control circuit of a pixel PX (refer to FIG. 3A).

The display element layer DP-OLED may be disposed on the circuit element layer DP-CL. The display element layer DP-OLED may include organic light emitting elements, however, this is merely one example. According to an embodiment, the display element layer DP-OLED may include inorganic light emitting elements, organic-inorganic light emitting elements, or a liquid crystal layer.

The thin film encapsulation layer TFL may include an organic layer and a plurality of inorganic layers. For example, the plurality of inorganic layers may encapsulate the organic layer. The thin film encapsulation layer TFL may encapsulate the display element layer DP-OLED to block or prevent moisture and oxygen from permeating to the display element layer DP-OLED.

The input sensor ISL may be disposed on the thin film encapsulation layer TFL. The input sensor ISL may be formed on the thin film encapsulation layer TFL through successive processes. In this case, the input sensor ISL may be described as being disposed directly on the display panel DP. The expression that the input sensor ISL is disposed directly on the display panel DP means that no other elements are disposed between the input sensor ISL and the display panel DP. For example, a separate adhesive member may not be disposed between the input sensor ISL and the display panel DP.

The input sensor ISL may sense the external input by using one of a self-capacitance method and a mutual capacitance method. Sensing patterns included in the input sensor ISL may be arranged and connected in various ways in accordance with the sensing method.

The light blocking layer PVL may be disposed on the input sensor ISL. The light blocking layer PVL may include a first planarization layer PVX1, a second planarization layer PVX2, and a light blocking pattern BM disposed between the first and second planarization layers PVX1 and PVX2. The light blocking layer PVL may be disposed on an area from which a light is emitted when the display device DD is operated in a private mode (hereinafter, referred to as a first operation mode) to prevent a mixture of colors of the light traveling within a narrow viewing angle.

The optical member POL may be disposed on the light blocking layer PVL and may reduce a reflectance of the display panel DP with respect to the external light incident into the display panel DP. As an example, the optical member POL may include at least one of an anti-reflective film, a polarization film, and a gray filter.

Referring to FIG. 2B, the display module DM-1 may include a display panel DP, an input sensor ISL, a light blocking layer PVL, and an optical filter member OM.

The optical filter member OM may be disposed on the light blocking layer PVL. The optical filter member OM may selectively transmit the light provided thereto from the display panel DP. The optical filter member OM may include a plurality of color filters and a light blocking pattern disposed between the color filters. The color filters may selectively transmit a corresponding light among red light, green light, and blue lights. In this case, each of the color filters may include a polymer photoresist and a pigment or a dye.

In addition, the optical filter member OM may further include a planarization layer disposed on the color filters. The planarization layer may be disposed on the color filters to cover concave-convex portions formed during processes of forming the color filters. Accordingly, components disposed on the optical filter member OM may be stably coupled to the optical filter member OM.

Figure 3A:
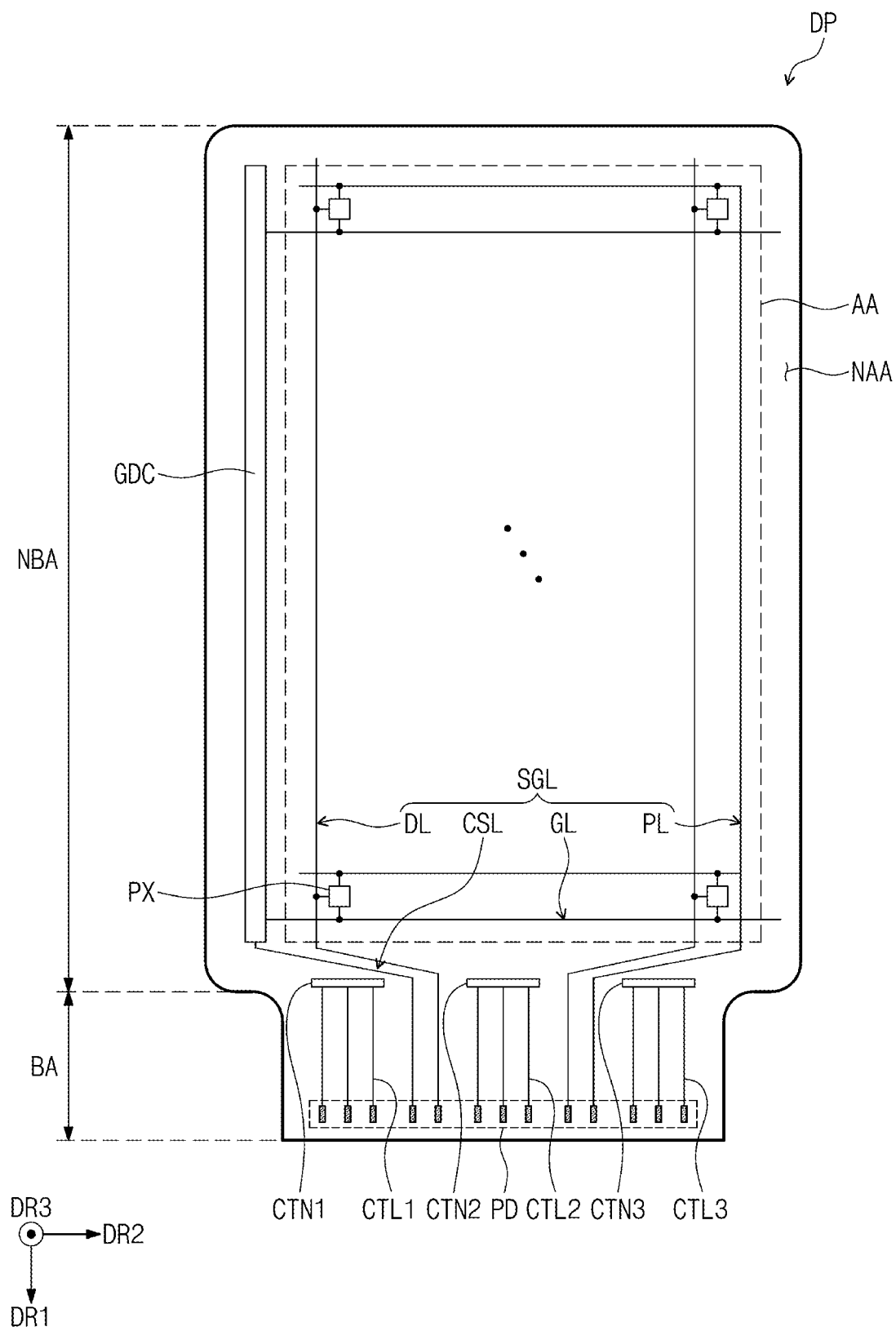
FIG. 3A is a plan view of a display panel of FIG. 1B.
Figure 3B:
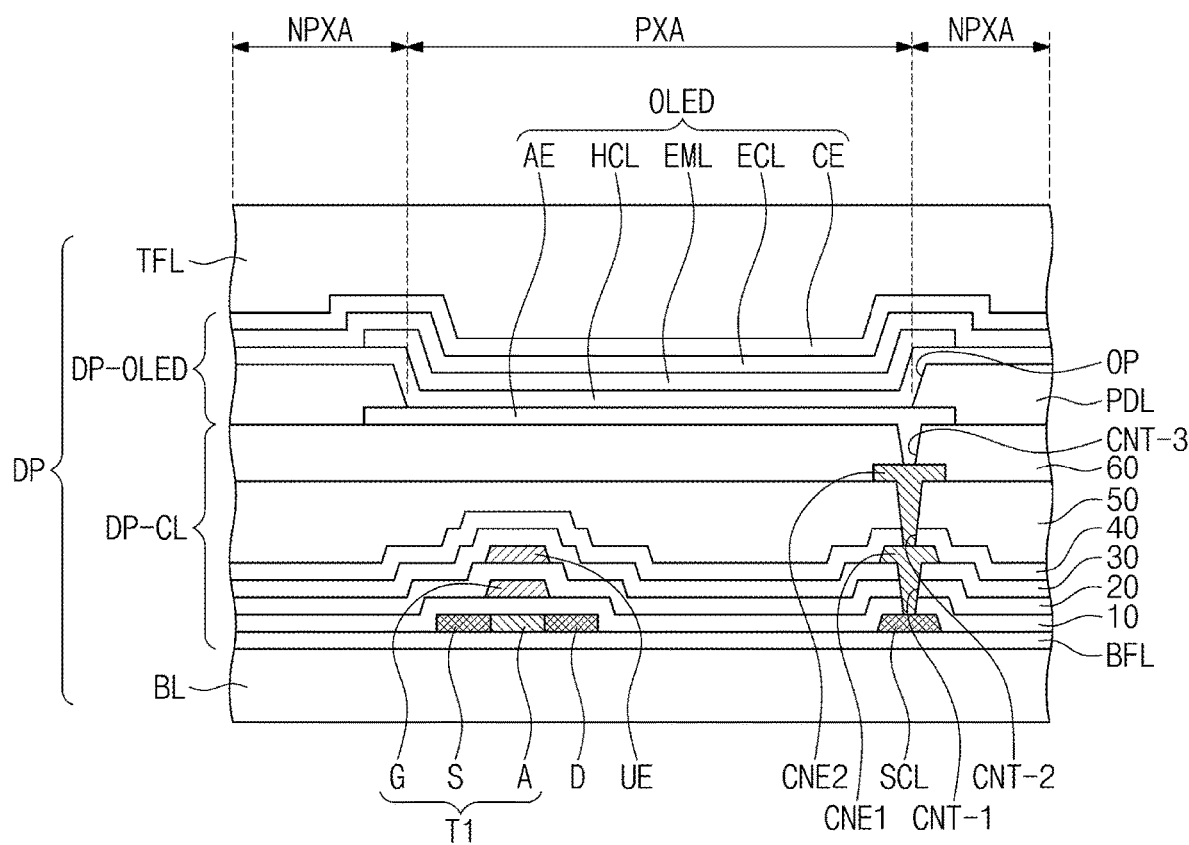
FIG. 3B is a cross-sectional view showing a portion of the display panel of FIG. 3A.

FIG. 3A is a plan view showing a display panel DP according to an embodiment. FIG. 3B is a cross-sectional view showing the display panel DP according to an embodiment.

Referring to FIG. 3A, the display panel DP may include an active area AA and a peripheral area NAA. The active area AA of the display panel DP may be the area through which the image is displayed, and the peripheral area NAA of the display panel DP may be the area in which the driving circuit or the driving line is disposed. Light emitting elements of pixels PX may be disposed in the active area AA.

The display panel DP may include a driving circuit GDC, a plurality of signal lines SGL, the pixels PX, a plurality of lower contact holes CTN1, CTN2, and CTN3, a plurality of contact lines CTL1, CTL2, and CTL3, and a plurality of pads PD. Each pad PD may be connected to a corresponding contact line among the plurality of contact lines CTL1, CTL2, and CTL3.

Each of the pixels PX may include the light emitting element and a plurality of transistors connected to the light emitting element. The pixels PX may emit a light in response to an electrical signal applied thereto.

The signal lines SGL may include scan lines GL, data lines DL, a power line PL, and a control signal line CSL. Each of the scan lines GL may be connected to corresponding pixels among the pixels PX. Each of the data lines DL may be connected to corresponding pixels among the pixels PX. The power line PL may be connected to the pixels PX and may provide a power source voltage to the pixels PX. The control signal line CSL may apply control signals to a scan driving circuit.

The driving circuit GDC may be disposed in the peripheral area NAA. The driving circuit GDC may include the scan driving circuit. The scan driving circuit may generate scan signals and may sequentially output the scan signals to the scan lines GL. The scan driving circuit may further output another control signal to the driving circuit of the pixels PX.

The display panel DP may include a bending area BA and a non-bending area NBA adjacent to the bending area BA. The bending area BA of the display panel DP may be an area that is bent toward a rear surface of the display panel DP together with the flexible circuit board CF, which is attach to the area, as described with reference to FIG. 1B. Accordingly, the flexible circuit board CF and the main circuit board MB may be disposed on the rear surface of the display panel DP while being attached to the bending area BA of the display panel DP. The signal lines SGL may extend to the bending area BA from the non-bending area NBA and may be connected to corresponding pads PD.

The display panel DP may include the lower contact holes CTN1, CTN2, and CTN3 defined in the peripheral area NAA. The lower contact holes CTN1, CTN2, and CTN3 may overlap upper contact holes CTN-1, CTN-2, and CTN-3 of the input sensor ISL (e.g., in FIG. 5A) described later.

The contact lines CTL1, CTL2, and CTL3 may extend to the bending area BA from the lower contact holes CTN1, CTN2, and CTN3 and may be connected corresponding pads PD.

FIG. 3A shows three lower contact holes CTN1, CTN2, and CTN3, however, this is merely a representative example of an arrangement of the lower contact holes. The arrangement and the number of the lower contact holes should not be particularly limited as long as the lower contact holes overlap the upper contact holes of the input sensor ISL.

Referring to FIG. 3B, the display panel DP may include the base layer BL, the circuit element layer DP-CL, the display element layer DP-OLED, and the thin film encapsulation layer TFL. However, embodiments are not limited to a stack structure of the display panel DP.

The base layer BL may include a synthetic resin film. The base layer BL may include a glass substrate, a metal substrate, or an organic/inorganic composite substrate. At least one inorganic layer may be disposed on an upper surface of the base layer BL. A buffer layer BFL may increase a coupling force between the base layer BL and the semiconductor pattern. The buffer layer BFL may include a silicon oxide layer and a silicon nitride layer, and the silicon oxide layer and the silicon nitride layer may be alternately stacked with each other.

The semiconductor pattern may be disposed on the buffer layer BFL. The semiconductor pattern may include polysilicon, however, embodiments are not limited thereto or thereby. The semiconductor pattern may include amorphous silicon or oxide semiconductor.

As shown in FIG. 3B, a source region S, an active region A, and a drain region D of a transistor T1 may be formed from the semiconductor pattern. FIG. 3B shows a portion of a signal transmission area SCL formed from the semiconductor pattern. For example, the signal transmission area SCL may be connected to the drain region D of the transistor T1 in a plane.

First, second, third, fourth, fifth, and sixth insulating layers 10, 20, 30, 40, 50, and 60 may be disposed on the buffer layer BFL. Each of the first to sixth insulating layers 10 to 60 may be an inorganic layer or an organic layer. A gate region G of the transistor T1 may be disposed on the first insulating layer 10. An upper electrode UE may be disposed on the second insulating layer 20. A first connection electrode CNE1 may be disposed on the third insulating layer 30. The first connection electrode CNE1 may be connected to the signal transmission area SCL via a contact hole CNT-1 defined through the first, second, and third insulating layers 10, 20, and 30. A second connection electrode CNE2 may be on the fifth insulating layer 50. The second connection electrode CNE2 may be connected to the first connection electrode CNE1 via a contact hole CNT-2 defined through the fourth insulating layer 40 and the fifth insulating layer 50.

A light emitting element OLED may be disposed on the sixth insulating layer 60. A first electrode AE may be disposed on the sixth insulating layer 60. The first electrode AE may be connected to the second connection electrode CNE2 via a contact hole CNT-3 defined through the sixth insulating layer 60. A pixel definition layer PDL may be provided with an opening OP defined therethrough. At least a portion of the first electrode AE may be exposed through the opening OP. A light emitting area PXA may be defined to correspond to the portion of the first electrode AE exposed through the opening OP. The non-light-emitting area NPXA may correspond to an area of the active area AA (refer to FIG. 3A) except the light emitting area PXA. In an embodiment, the non-light-emitting area NPXA may be divided into the first non-light-emitting area NPXA1 (refer to FIG. 6C) and the second non-light-emitting area NPXA2 (refer to FIG. 6D).

A hole control layer HCL may be commonly disposed in the light emitting area PXA and the non-light-emitting area NPXA. The hole control layer HCL may include a hole transport layer and may further include a hole injection layer. A light emitting layer EML may be disposed on the hole control layer HCL. The light emitting layer EML may be disposed in an area corresponding to the opening OP. An electron control layer ECL may be disposed on the light emitting layer EML. The electron control layer ECL may include an electron transport layer and may further include an electron injection layer. A second electrode CE may be disposed on the electron control layer ECL.

The thin film encapsulation layer TFL may be disposed on the second electrode CE. The thin film encapsulation layer TFL may include a plurality of thin films. According to an embodiment, a capping layer may be further disposed under the thin film encapsulation layer TFL.

Figure 4:
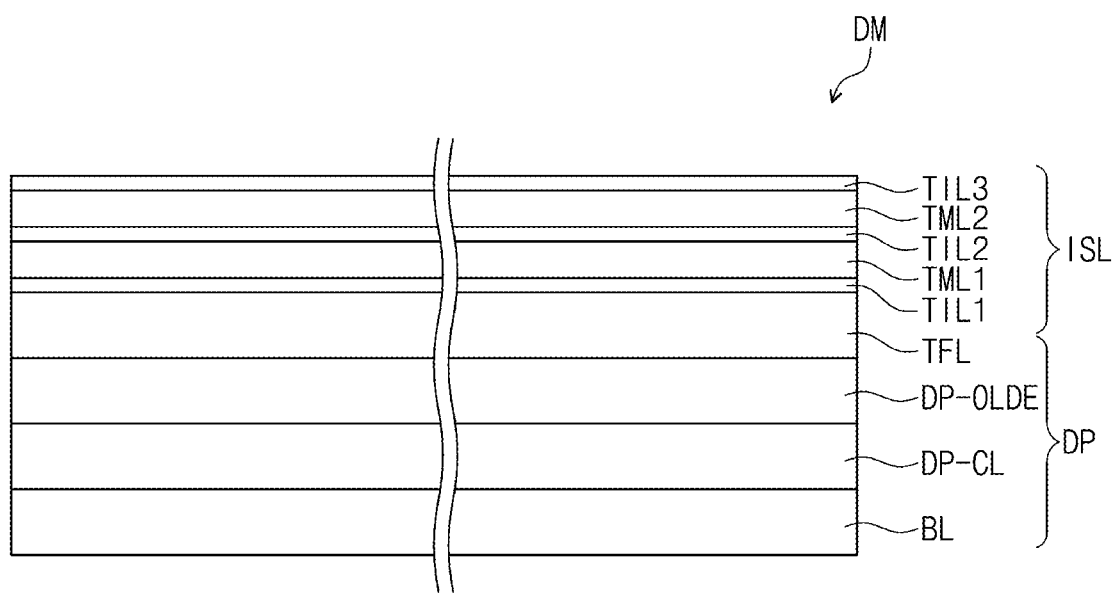
FIG. 4 is a cross-sectional view showing a portion of the display module of FIG. 1B.
Figure 4:
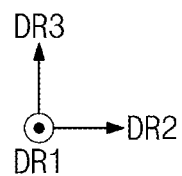
Figure 5A:
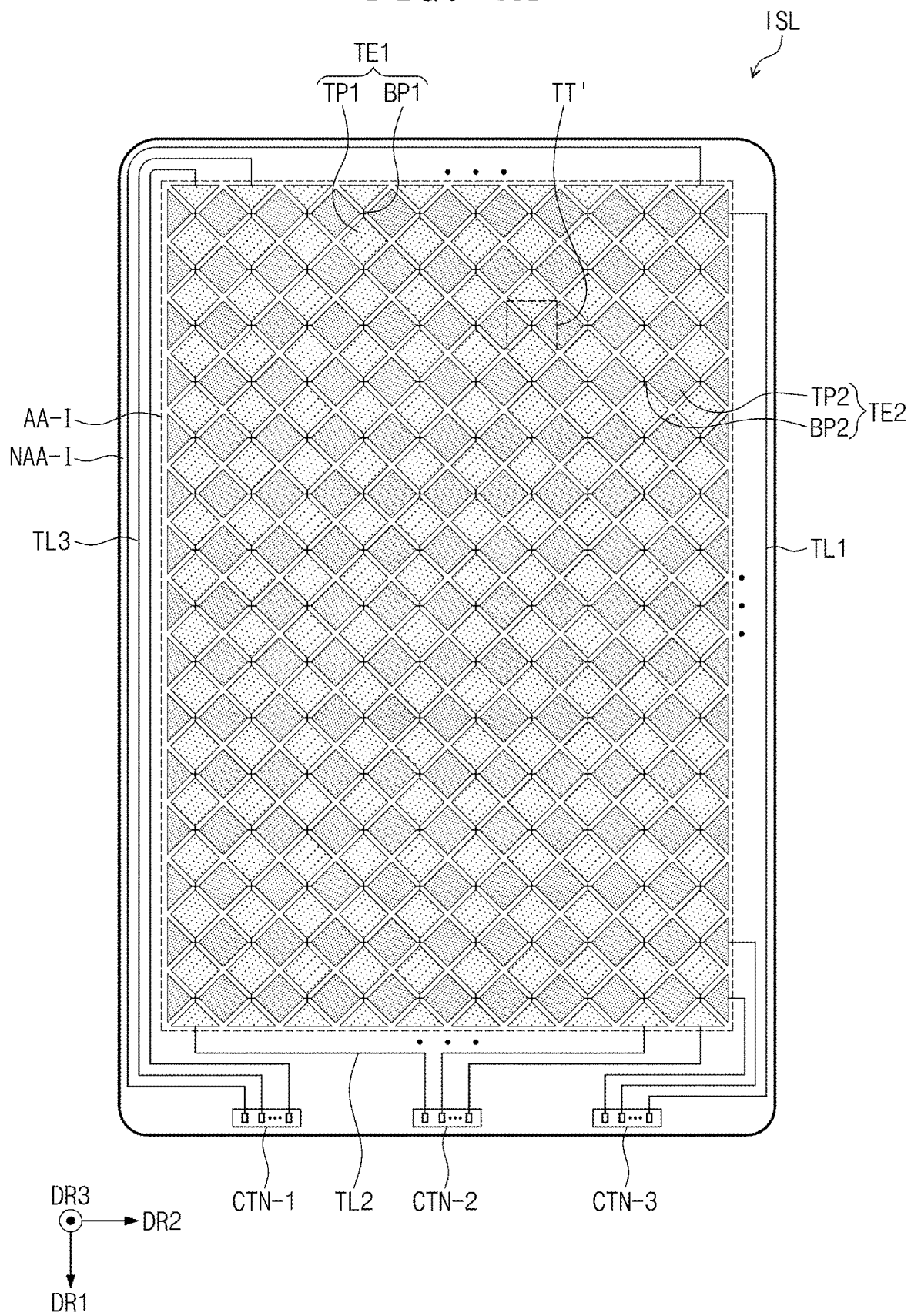
FIG. 5A is a plan view of an input sensor of FIG. 4.
Figure 5B:
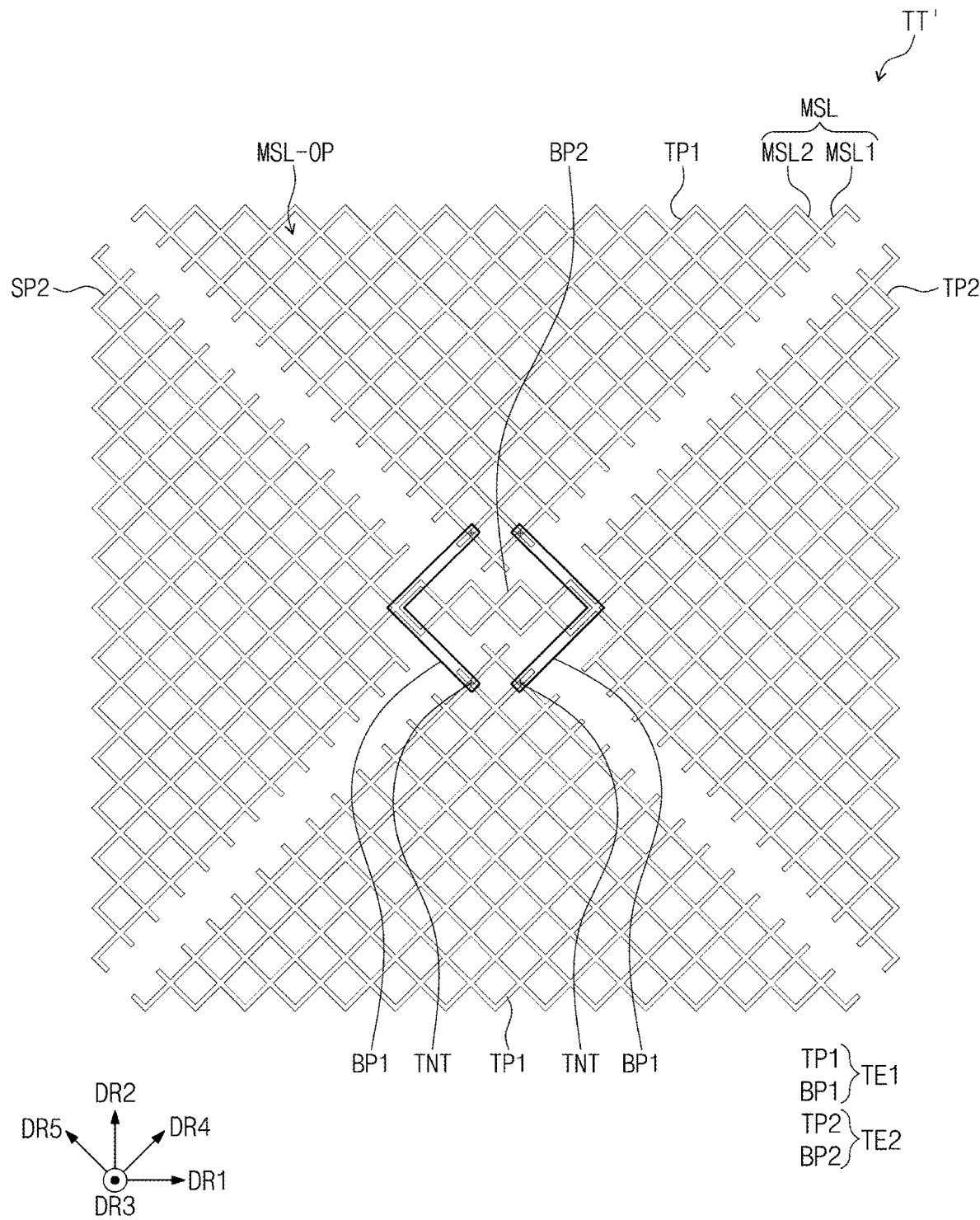
FIG. 5B is an enlarged plan view of an area TT' shown in FIG. 5A.

FIG. 4 is a cross-sectional view showing the display module DM according to an embodiment. FIG. 5A is a plan view showing the input sensor ISL according to an embodiment. FIG. 5B is an enlarged plan view showing an area TT' shown in FIG. 5A.

Referring to FIG. 4, the input sensor ISL of the display module DM may be disposed directly on the display panel DP. In the display module DM shown in FIG. 4, components disposed on the input sensor ISL among the components of the display module DM and DM-1 described with reference to FIGS. 2A and 2B are omitted for descriptive convenience. Since the stack structure of the display panel DP is described above with reference to FIG. 3B, details thereof will be omitted for descriptive convenience, and a stack structure of the input sensor ISL will be described.

The input sensor ISL may include a first sensing insulating layer TIL1, a first conductive layer TML1, a second sensing insulating layer TIL2, a second conductive layer TML2, and a third sensing insulating layer TIL3. The first sensing insulating layer TIL1 of the input sensor ISL may be disposed directly on the thin film encapsulation layer TFL.

Each of the first conductive layer TML1 and the second conductive layer TML2 may have a single-layer structure or a multi-layer structure. The conductive layer having the multi-layer structure may include two or more layers of a transparent conductive layer and a metal layer. The conductive layer having the multi-layer structure may include metal layers containing different metals from each other.

The first and second conductive layers TML1 and TML2 may be a transparent conductive layer and may include at least one of indium tin oxide (ITO), indium zinc oxide (IZO), zinc oxide (ZnO), indium tin zinc oxide (ITZO), PEDOT, metal nanowire, and graphene. The first and second conductive layers TML1 and TML2 may be the metal layer and may include molybdenum, silver, titanium, copper, aluminum, and alloys thereof.

Each of the first and second conductive layers TML1 and TML2 may have a three-layer structure of titanium/aluminum/titanium. Metals with a relatively high durability and a low reflectance may be applied as an outer layer of the conductive layer, and metals with a high electrical conductivity may be applied as an inner layer of the conductive layer.

Each of the first, second, and third sensing insulating layers TIL1, TIL2, and TIL3 may include an inorganic layer or an organic layer. According to an embodiment, each of the first and second sensing insulating layers TIL1 and TIL2 may include the inorganic layer. The third sensing insulating layer TIL3 may include the organic layer.

Referring to FIG. 5A, the input sensor ISL may include a plurality of sensing electrodes TE1 and TE2 and a plurality of sensing lines TL1, TL2, and TL3.

The input sensor ISL may include an active area AA-I and a peripheral area NAA-I adjacent to the active area AA-I. The active area AA-I and the peripheral area NAA-I of the input sensor ISL may correspond to the active area AA and the peripheral area NAA of the display panel DP, respectively.

The sensing electrodes TE1 and TE2 may include a first sensing electrode TE1 and a second sensing electrode TE2.

The first sensing electrode TE1 may extend in the first direction DR1 and may be provided in plural, and the first sensing electrodes TE1 may be arranged in the second direction DR2. The first sensing electrode TE1 may include first sensing patterns TP1 and first conductive patterns BP1. The first sensing patterns TP1 may be arranged in the first direction DR1. At least one first conductive pattern BP1 may be connected to two first sensing patterns TP1 adjacent to each other.

The second sensing electrode TE2 may extend in the second direction DR2 and may be provided in plural, and the second sensing electrodes TE2 may be arranged in the first direction DR1. The second sensing electrode TE2 may include second sensing patterns TP2 and second conductive patterns BP2. The second sensing patterns TP2 and the second conductive patterns BP2 may be patterned through the same process and may be provided integrally with each other, however, for the convenience of explanation, the patterns will be described separately as the second sensing patterns TP2 and the second conductive patterns BP2.

The second sensing patterns TP2 may be arranged in the second direction DR2. At least one second conductive pattern BP2 may be disposed between two second sensing patterns TP2 adjacent to each other.

The sensing lines TL1, TL2, and TL3 may include a first sensing line TL1, a second sensing line TL2, and a third sensing line TL3.

According to an embodiment, the input sensor ISL may include the upper contact holes CTN-1, CTN-2, and CTN-3 defined in the peripheral area NAA-I. The upper contact holes CTN-1, CTN-2, and CTN-3 may be formed through the first sensing insulating layer TIL1 and the second sensing insulating layer TIL2. The upper contact holes CTN-1, CTN-2, and CTN-3 may overlap the lower contact holes CTN1, CTN2, and CTN3, respectively.

One end of the first sensing line TL1 may be connected to the second sensing electrode TE2, and the other end of the first sensing line TL1 may extend to a third upper contact hole CTN-3. The other end of the first sensing line TL1 may be connected to the third contact line CTL3 (refer to FIG. 3A) via a third lower contact hole CTN3 (refer to FIG. 3A) and the third upper contact hole CTN-3 overlapping the third lower contact hole CTN3.

One end of the second sensing line TL2 may be connected to the one end of the first sensing electrode TE1, and the other end of the second sensing line TL2 may extend to a second upper contact hole CTN-2. The other end of the second sensing line TL2 may be connected to the second contact line CTL2 (refer to FIG. 3A) via a second lower contact hole CTN2 (refer to FIG. 3A) and the second upper contact hole CTN-2 overlapping the second lower contact hole CTN2.

One end of the third sensing line TL3 may be connected to the other end of the first sensing electrode TE1, and the other end of the third sensing line TL3 may extend to a first upper contact hole CTN-1. The other end of the third sensing line TL3 may be connected to the first contact line CTL1 (refer to FIG. 3A) via a first lower contact hole CTN1 (refer to FIG. 3A) and the first upper contact hole CTN-1 overlapping the first lower contact hole CTN1.

According to an embodiment, the first sensing electrode TE1 may be connected to the second sensing line TL2 and the third sensing line TL3. Accordingly, the first sensing electrode TE1 having a relatively longer length than that of the second sensing electrode TE2 may have uniform sensitivity over the entire area thereof.

The contact lines CTL1, CTL2, and CTL3 may be connected to corresponding pads PD and thus may be connected to the pads of the flexible circuit board CF (refer to FIG. 1B). Accordingly, the sensing electrodes TE1 and TE2 may be electrically connected to the flexible circuit board CF connected to the bending area BA of the display panel DP and the main circuit board MB.

However, according to an embodiment, only one of the one end and the other end of the first sensing electrode TE1 may be connected to the sensing line, and in this case, one of the first and second upper contact holes CTN-1 and CTN-2 may be omitted.

FIG. 5B is a plan view showing an arrangement of the first sensing patterns TP1, the first conductive patterns BP1, the second sensing patterns TP2, and the second conductive patterns BP2.

According to an embodiment, the first sensing patterns TP1 of the first sensing electrode TE1 and the second sensing patterns TP2 and the second conductive patterns BP2 of the second sensing electrode TE2 may include mesh lines MSL. The mesh lines MSL may include a first mesh line MSL1 extending in a fourth direction DR4 and a second mesh line MSL2 extending in a fifth direction DR5.

The first and second mesh lines MSL1 and MSL2 may not overlap the light emitting area PXA described later and may overlap the non-light-emitting area NPXA. The first and second mesh lines MSL1 and MSL2 may have a line width of several nanometers to several micrometers. The first and second mesh lines MSL1 and MSL2 may define a plurality of mesh openings MSL-OP. The mesh openings MSL-OP may correspond to the light emitting areas PXA described later in a one-to-one correspondence. For example, the mesh openings MSL-OP may have a polygon shape such as a rectangular shape or lozenge shape.

According to an embodiment, the first sensing patterns TP1 and the second sensing electrode TE2 may form the second conductive layer TML2 described with reference to FIG. 4.

The first sensing patterns TP1 may be connected to a corresponding first conductive pattern among the first conductive patterns BP1 via a sensing contact hole TNT defined through the second sensing insulating layer TIL2. Accordingly, although the first sensing patterns TP1 are disposed on the same layer as the second sensing electrode TE2, the first sensing patterns TP1 may be disposed to be insulated from the second sensing electrode TE2 due to the first conductive patterns BP1 disposed on the first sensing insulating layer TIL1. Accordingly, the first conductive patterns BP1 and the second conductive patterns BP2, which are disposed on different layers from each other, may overlap each other when viewed in a plane.

A portion of each of the sensing lines TL1, TL2, and TL3 may be included in the first conductive layer TML1, and the other portion of each of the sensing lines TL1, TL2, and TL3 may be included in the second conductive layer TML2. Lines disposed on different layers from each other may be connected to each other via contact holes defined through the second sensing insulating layer TIL2, however, embodiments are not limited thereto or thereby. According to an embodiment, the sensing lines TL1, TL2, and TL3 may be included in only one layer of the first conductive layer TML1 and the second conductive layer TML2.

Figure 6A:
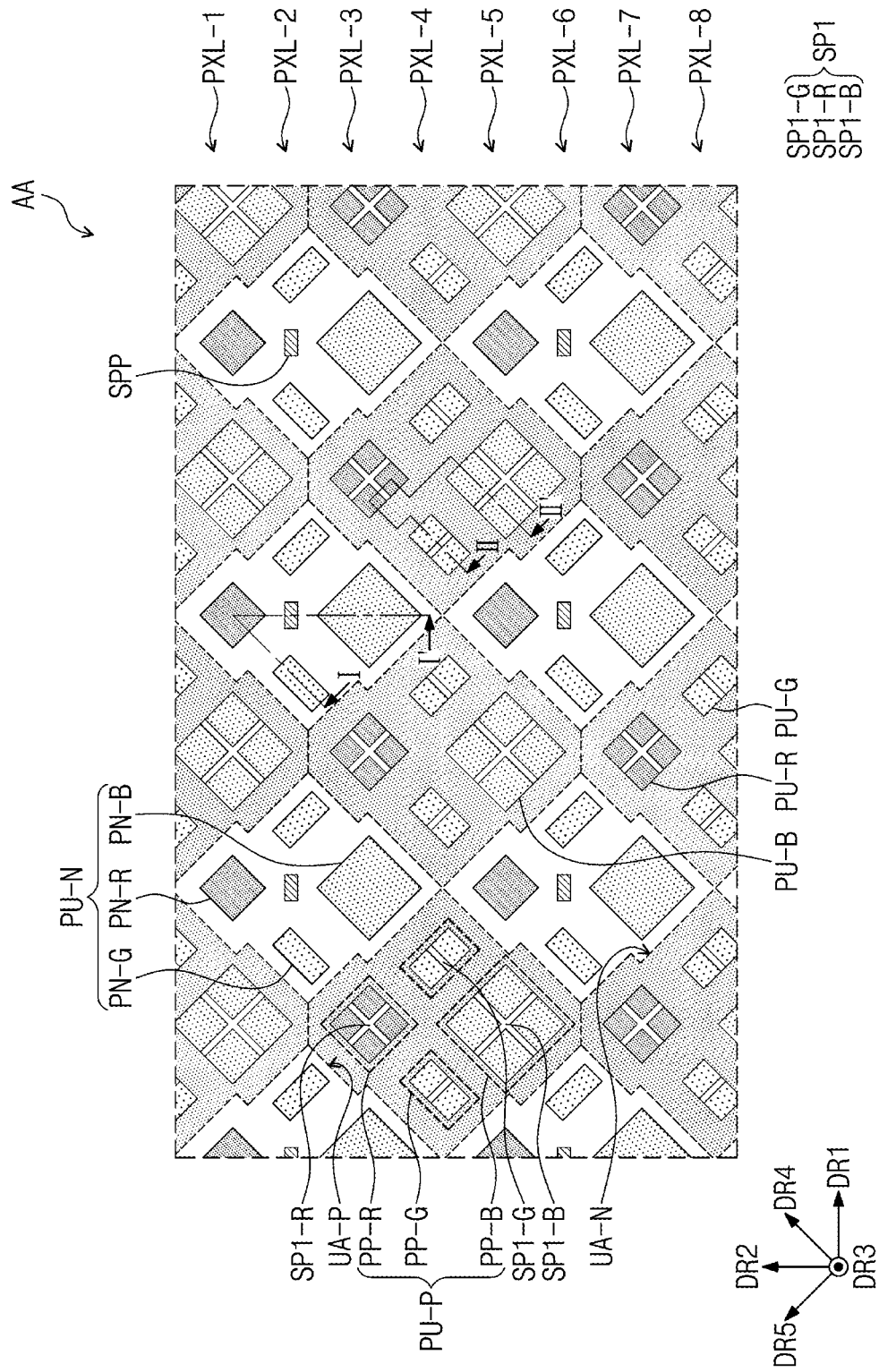
FIG. 6A is a plan view of an embodiment of an active area of the display module of FIG. 1B.
Figure 6B:
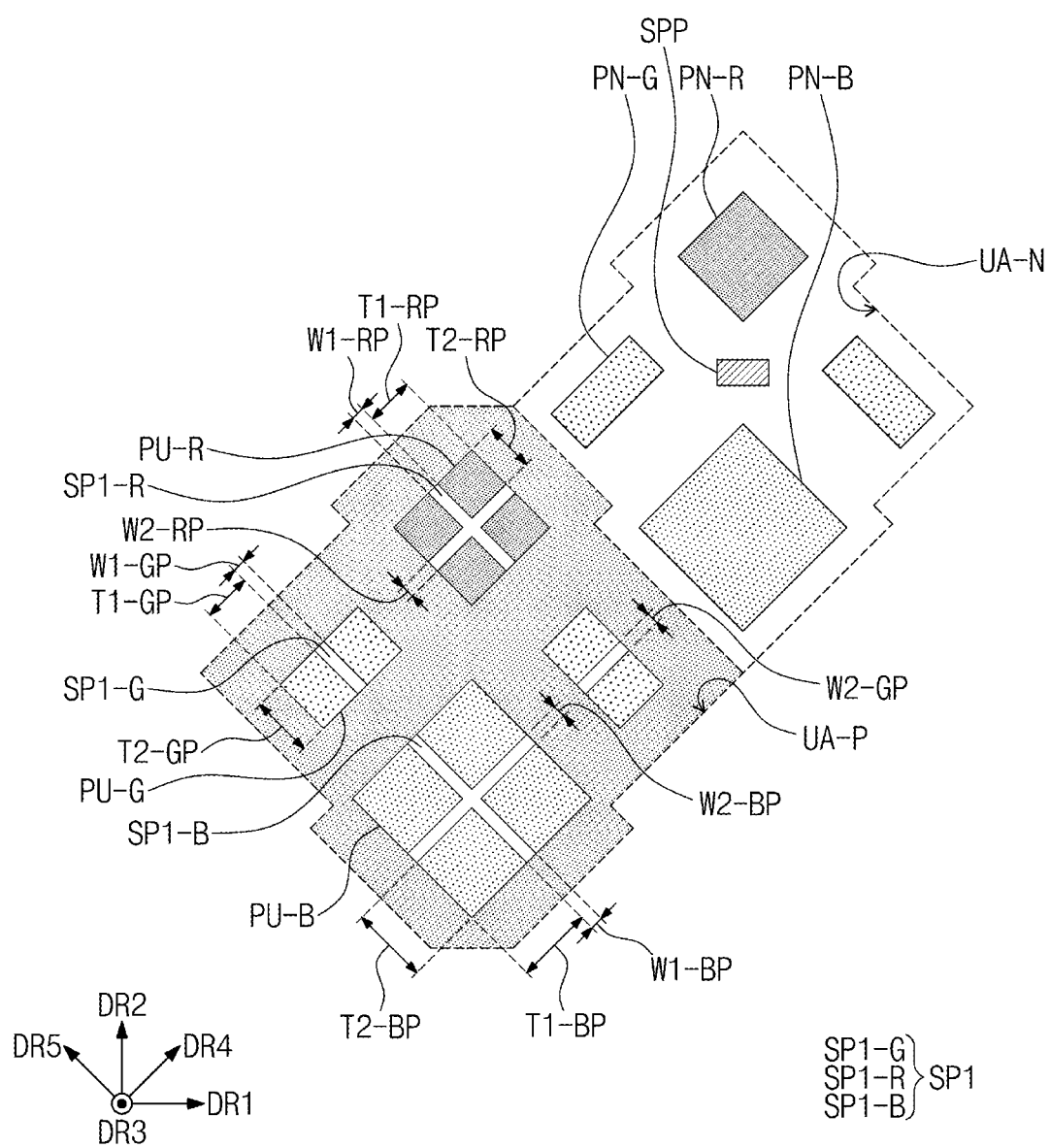
FIG. 6B is an enlarged plan view of a portion of the active area of FIG. 6A.
Figure 6C:
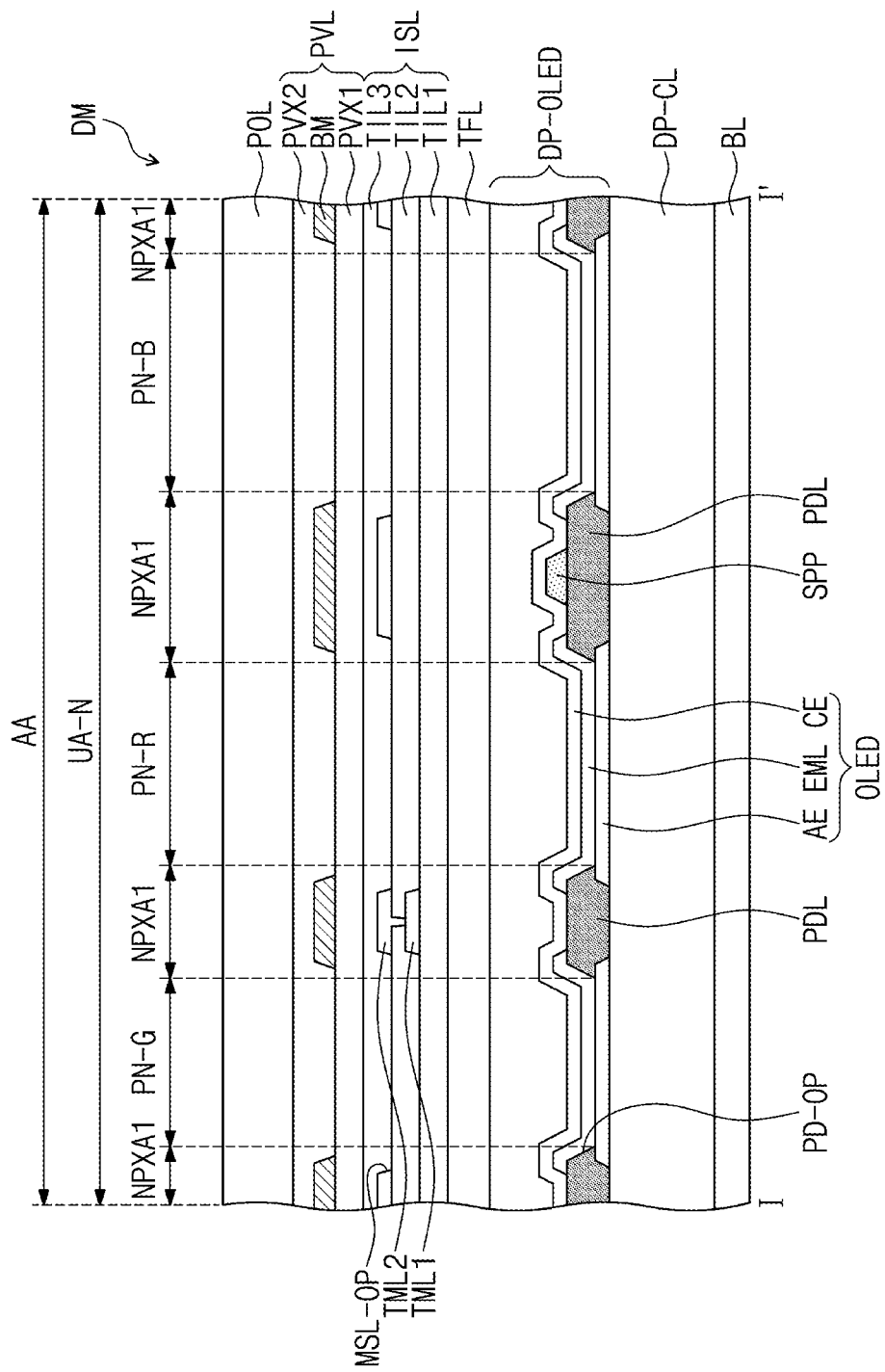
FIG. 6C is a cross-sectional view taken along a line I-I' of FIG. 6A.
Figure 6D:
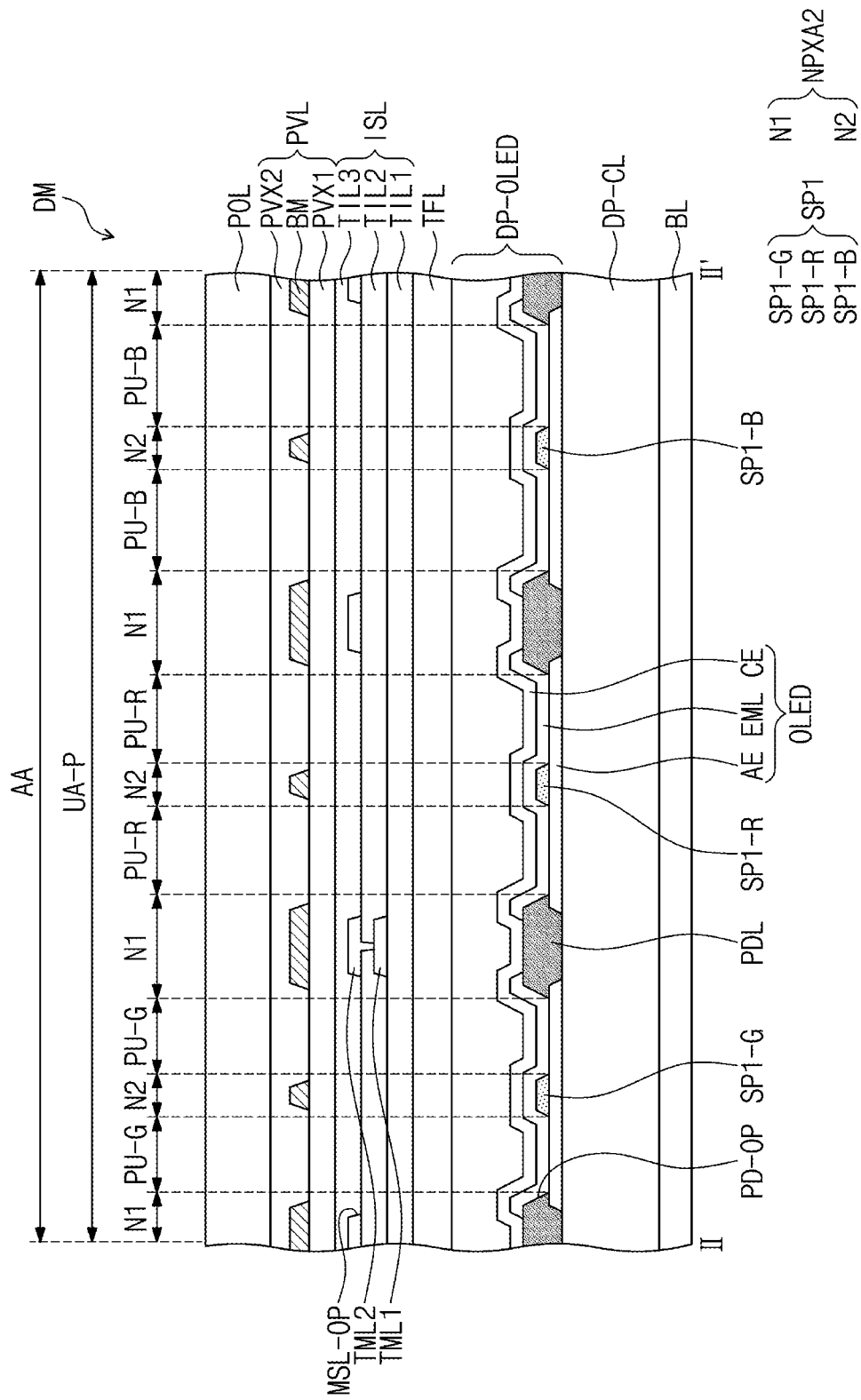
FIG. 6D is a cross-sectional view taken along a line II-II' of FIG. 6A.

FIG. 6A is a plan view showing the active area according to an embodiment. FIG. 6B is an enlarged plan view showing a portion of the active area according to an embodiment. FIG. 6C is a cross-sectional view taken along a line I-I' of FIG. 6A to show the display module DM. FIG. 6D is a cross-sectional view taken along a line II-II' of FIG. 6A to show the display module DM.

Referring to FIG. 6A, the active area AA of the display panel DP (refer to FIG. 3A) may include a first area UA-N and a second area UA-P. The first area UA-N and the second area UA-P may include light emitting areas that emit lights of different colors from each other.

The light emitting areas may define a plurality of pixel rows PXL-1 to PXL-8 extending in the second direction DR2. The pixel rows PXL-1 to PXL-8 may be arranged in the second direction DR2.

As an example, the first area UA-N may include a plurality of first, second, and third light emitting areas PN-G, PN-R, and PN-B. According to an embodiment, the first light emitting area PN-G having the smallest size among the first, second, and third light emitting areas PN-G, PN-R, and PN-B may be provided in plural in the first area UA-N.

In the first area UA-N, two first light emitting areas PN-G may be spaced apart from each other in the first direction DR1, and the second light emitting area PN-R and the third light emitting area PN-B may be spaced apart from each other in the second direction DR2. The second light emitting area PN-R and the third light emitting area PN-B may be spaced apart from the first light emitting area PN-G in the fourth direction DR4 and the fifth direction DR5, which intersect the first direction DR1 and the second direction DR2.

The second area UA-P may include a plurality of fourth, fifth, and sixth light emitting areas PP-G, PP-R, and PP-B. According to an embodiment, the fourth light emitting area PP-G having the smallest size among the fourth, fifth, and sixth light emitting areas PP-G, PP-R, and PP-B may be provided in plural in the second area UA-P.

In the second area UA-P, two fourth light emitting areas PP-G may be spaced apart from each other in the first direction DR1, and the fifth light emitting area PP-R and the sixth light emitting area PP-B may be spaced apart from each other in the second direction DR2. The fifth light emitting area PP-R and the sixth light emitting area PP-B may be spaced apart from the fourth light emitting area PP-G in the fourth direction DR4 and the fifth direction DR5, which cross the first direction DR1 and the second direction DR2.

According to an embodiment, each of the fourth, fifth, and sixth light emitting areas PP-G, PP-R, and PP-B included in the second area UA-P may correspond to the fourth, fifth, and sixth sub-unit areas PU-G, PU-R, and PU-B.

As an example, each of the fourth light emitting areas PP-G included in the second area UA-P may include two fourth sub-unit areas PU-G. In the second area UA-P, two fourth sub-unit areas disposed at a left side among the fourth sub-unit areas PU-G may be arranged in the fourth direction DR4, and two fourth sub-unit areas disposed at a right side among the fourth sub-unit areas PU-G may be arranged in the fifth direction DR5.

The fifth light emitting area PP-R may include four fifth sub-unit areas PU-R. The four fifth sub-unit areas PU-R may be arranged in two rows by two columns with respect to the fourth direction DR4 or the fifth direction DR5.

The sixth light emitting area PP-B may include four sixth sub-unit areas PU-B. The four sixth sub-unit areas PU-B may be arranged in two rows by two columns with respect to the fourth direction DR4 or the fifth direction DR5.

According to an embodiment, the first light emitting area PN-G of the first area UA-N may provide a light having a first color that is substantially the same as a color of a light provided by the fourth light emitting area PP-G of the second area UA-P. Accordingly, the fourth sub-unit areas PU-G included in the fourth light emitting area PP-G of the second area UA-P may provide the light having substantially the same color as that of the light provided by the first light emitting area PN-G of the first area UA-N. The first color may be a green color.

The second light emitting area PN-R of the first area UA-N may provide a light having a second color that is substantially the same as a color of a light provided by the fifth light emitting area PP-R of the second area UA-P. Accordingly, the fifth sub-unit areas PU-R included in the fifth light emitting area PP-R of the second area UA-P may provide the light having substantially the same color as that of the light provided by the second light emitting area PN-R of the first area UA-N. The second color may be a red color.

The third light emitting area PN-B of the first area UA-N may provide a light having a third color that is substantially the same as a color of a light provided by the sixth light emitting area PP-B of the second area UA-P. Accordingly, the sixth sub-unit areas PU-B included in the sixth light emitting area PP-B of the second area UA-P may provide the light having substantially the same color as that of the light provided by the third light emitting area PN-B of the first area UA-N. The third color may be a blue color.

However, embodiments are not limited thereto or thereby. For example, the lights having the first, second, and third colors should not be particularly limited as long as a combination of the lights having the first, second, and third colors may generate a white light.

In an embodiment, the light provided from each of the light emitting areas included in the first area UA-N and the second area UA-P may be provided from a corresponding pixel that is activated among the pixels PX (refer to FIG. 3A). Hereinafter, for the convenience of explanation, a first pixel PU-N is described as being activated when the light is provided from the first, second, and third light emitting areas PN-G, PN-R, and PN-B included in the first area UA-N, and a second pixel PU-P is described as being activated when the light is provided from the fourth, fifth, and sixth light emitting areas PP-G, PP-R, and PP-B included in the second area UA-P.

According to an embodiment, the first area UA-N may include support patterns SPP in the form of a first support pattern. Each of the support patterns SPP may be disposed at a center of the first area UA-N and may be surrounded by the first, second, and third light emitting areas PN-G, PN-R, and PN-B. As an example, each of the support patterns SPP may be disposed between the first light emitting areas PN-G, and may be spaced apart from the first light emitting areas PN-G in the first direction DR1. Each of the support patterns SPP may be disposed between the second and third light emitting areas PN-R and PN-B, and may be spaced apart from the second and third light emitting areas PN-R and PN-B in the second direction DR2.

As shown in FIG. 6A, the support patterns SPP may be disposed to overlap only the first area UA-N. Since a separation distance between the first, second, and third light emitting areas PN-G, PN-R, and PN-B of the first area UA-N is greater than a separation distance between the fourth, fifth, and sixth light emitting areas PP-G, PP-R, and PP-B of the second area UA-P, a space for the support pattern SPP may be provided.

However, embodiments are not limited to the arrangement of the support patterns SPP. The support patterns SPP may also be disposed in the second area UA-P and may be disposed near a boundary between the first and second areas UA-N and UA-P. Details thereof will be described later.

According to an embodiment, the support patterns SPP may include one of a polymer material and a silicon material. The polymer material may include polyimide (PI).

According to an embodiment, the second area UA-P may include first division patterns SP1. The first division patterns SP1 may be disposed between the fourth, fifth, and sixth sub-unit areas PU-G, PU-R, and PU-B. The first division patterns SP1 may include first-first division patterns SP1-G, first-second division patterns SP1-R, and first-third division patterns SP1-B.

As an example, each of the first-first division patterns SP1-G may be disposed in a corresponding fourth sub-unit area among the fourth sub-unit areas PU-G. As an example, one first division pattern of the second area UA-P may be disposed between two fourth sub-unit areas arranged in the fourth direction DR4 and may have a rectangular shape extending in the fifth direction DR5. The other first division pattern may be disposed between two fourth sub-unit areas arranged in the fifth direction DR5 and may have a rectangular shape extending in the fourth direction DR4.

Each of the first-second division patterns SP1-R may be disposed between four fifth sub-unit areas PU-R. Each of the first-second division patterns SP1-R may extend in the fourth direction DR4 and the fifth direction DR5 to have a cross shape.

Each of the first-third division patterns SP1-B may be disposed between four sixth sub-unit areas PU-B. Each of the first-third division patterns SP1-B may extend in the fourth direction DR4 and the fifth direction DR5 to have a cross shape.

According to an embodiment, the first division patterns SP1 may include the polymer material and the silicon material. The polymer material may include polyimide (PI). In an embodiment, the first division patterns SP1 may include the same material as the support patterns SPP.

Referring to FIG. 6B, the light emitting areas emitting the lights having different colors may have different sizes from each other. As an example, the first light emitting area PN-G may have the smallest size among the first, second, and third light emitting areas PN-G, PN-R, and PN-B of the first area UA-N. Among the first, second, and third light emitting areas PN-G, PN-R, and PN-B of the first area UA-N, the third light emitting area PN-B may have the largest size, and the second light emitting area PN-R may have a size greater than the size of the first light emitting area PN-G and smaller than the size of the third light emitting area PN-B. The first light emitting area PN-G having the smallest size may be provided in plural in the first area UA-N.

According to an embodiment, the sizes of the fourth, fifth, and sixth light emitting areas PP-G, PP-R, and PP-B (refer to FIG. 6A) of the second area UA-P may correspond to a size ratio of the first, second, and third light emitting areas PN-G, PN-R, and PN-B of the first area UA-N. In the second area UA-P, each of the fourth, fifth, and sixth light emitting areas PP-G, PP-R, and PP-B may be defined by a sum of sizes of the sub-unit areas included in one light emitting area.

As an example, the size of the fourth light emitting area PP-G of the second area UA-P may be defined by a sum of sizes of the two fourth sub-unit areas PU-G included in one first light emitting area. The size of the fifth light emitting area PP-R of the second area UA-P may be defined by a sum of sizes of four fifth sub-unit areas PU-R. The size of the sixth light emitting area PP-B of the second area UA-P may be defined by a sum of sizes of four sixth sub-unit areas PU-B.

According to an embodiment, the fourth light emitting area PP-G may have the smallest size among the fourth, fifth, and sixth light emitting areas PP-G, PP-R, and PP-B of the second area UA-P. The sixth light emitting area PP-B may have the largest size among the fourth, fifth, and sixth light emitting areas PP-G, PP-R, and PP-B of the second area UA-P. The fifth light emitting area PP-R may have a size greater than the size of the fourth light emitting area PP-G and smaller than the size of the sixth light emitting area PP-B. The fourth light emitting area PP-G having the smallest size may be provided in plural in the second area UA-P.

Each of the fourth sub-unit areas PU-G may include a first-first sub-unit side T1-GP and a first-second sub-unit side T2-GP, which respectively extend in the fourth direction DR4 and the fifth direction DR5. Each of the fifth sub-unit areas PU-R may include a first-third sub-unit side T1-RP and a first-fourth sub-unit side T2-RP, which respectively extend in the fourth direction DR4 and the fifth direction DR5. Each of the sixth sub-unit areas PU-B may include a first-fifth sub-unit side T1-BP and a first-sixth sub-unit side T2-BP, which respectively extend in the fourth direction DR4 and the fifth direction DR5.

According to an embodiment, the first-first sub-unit side T1-GP and the first-second sub-unit side T2-GP of each of the fourth sub-unit areas PU-G may have different widths from each other. As an example, in the second area UA-P, the first-first sub-unit side T1-GP may have a length smaller than a length of the first-second sub-unit side T2-GP in each of the fourth sub-unit areas PU-G included in one fourth light emitting area PP-G. In the second area UA-P, the first-first sub-unit side T1-GP may have a length greater than a length of the first-second sub-unit side T2-GP in each of the fourth sub-unit areas PU-G included in the other fourth light emitting area PP-G.

The first-third sub-unit side T1-RP and the first-fourth sub-unit side T2-RP of each of the fifth sub-unit areas PU-R may have substantially the same width as each other. The first-fifth sub-unit side T1-BP and the first-sixth sub-unit side T2-BP of each of the sixth sub-unit areas PU-B may have substantially the same width as each other.

However, embodiments are not limited to the shape of the fourth, fifth, and sixth sub-unit areas PU-G, PU-R, and PU-B. As an example, all the fourth, fifth, and sixth sub-unit areas PU-G, PU-R, and PU-B may have a square shape in which a length of the side extending in the fourth direction DR4 and a length of the side extending in the fifth direction DR5 are substantially the same as each other or may have a rectangular shape in which the length of the side extending in the fourth direction DR4 and the length of the side extending in the fifth direction DR5 are different from each other. In addition, each of the fourth, fifth, and sixth sub-unit areas PU-G, PU-R, and PU-B may have a circular shape.

The first-first division patterns SP1-G may include a short side extending in the fourth direction DR4 or a short side extending in the fifth direction DR5, the short side extending in the fourth direction DR4 may have a first-first division width W1-GP, and the short side extending in the fifth direction DR5 may have a first-second division width W2-GP.

Each of the first-second division patterns SP1-R may have a first-third division width W1-RP extending in the fourth direction DR4 between the fifth sub-unit areas PU-R and a first-fourth division width W2-RP extending in the fifth direction DR5 between the fifth sub-unit areas PU-R.

Each of the first-third division patterns SP1-B may have a first-fifth division width W1-BP extending in the fourth direction DR4 between the sixth sub-unit areas PU-B and a first-sixth division width W2-BP extending in the fifth direction DR5 between the sixth sub-unit areas PU-B.

According to an embodiment, the first-first and first-second division widths W1-GP and W2-GP of each of the first-first division patterns SP1-G may be substantially the same as the first-third and first-fourth division widths W1-RP and W2-RP of each of the first-second division patterns SP1-R and the first-fifth and first-sixth division widths W1-BP and W2-BP of each of the first-third division patterns SP1-B.

However, embodiments are not limited thereto or thereby, the first-first, first-second, first-third, first-fourth, first-fifth, and first-sixth division widths W1-GP, W2-GP, W1-RP, W2-RP, W1-BP, and W2-BP may be different from each other, and in this case, the fourth, fifth, and sixth sub-unit areas PU-G, PU-R, and PU-B may be adjusted by the division width of each of the first-first, first-second, and first-third division patterns SP1-G, SP1-R, and SP1-B.

The display panel DP (refer to FIG. 1B) of the display module DM shown in FIGS. 6C and 6D may have a stack structure corresponding to the stack structure of the display panel DP described with reference to FIG. 3B, and the same descriptions will not be repeated for descriptive convenience.

As shown in FIGS. 6C and 6D, the display module DM may include the display panel DP, the input sensor ISL, the light blocking layer PVL, and the optical member POL in the active area AA. The display panel DP may include the base layer BL, the circuit element layer DP-CL, the display element layer DP-OLED, and the thin film encapsulation layer TFL.

FIGS. 6C and 6D show only the first electrode AE, the light emitting layer EML, and the second electrode CE among the components of the light emitting element OLED, and the hole control layer HCL (refer to FIG. 3B) and the electron control layer ECL (refer to FIG. 3B) are omitted. Each of the first electrode AE and the light emitting layer EML may be individually disposed in a respective light emitting element, and the second electrode CE may be provided as a single pattern and may be commonly disposed over the light emitting elements, however, embodiments are not limited thereto or thereby. The light emitting layer EML may also be provided as a single pattern and may be commonly disposed over the light emitting elements.

According to an embodiment, the display element layer DP-OLED may include the pixel definition layer PDL and the support patterns SPP. The pixel definition layer PDL may be disposed on the circuit element layer DP-CL. The pixel definition layer PDL may be provided with a display opening PD-OP defined therethrough to expose at least a portion of the first electrode AE. The display opening PD-OP may be provided in plural, and the display openings PD-OP may correspond to the first electrodes respectively disposed in the light emitting elements.

In the first area UA-N, the light emitting area may be defined by the display opening PD-OP defined through the pixel definition layer PDL. Accordingly, a difference in size between the first, second, and third light emitting areas PN-G, PN-R, and PN-B defined in the first area UA-N may be caused by a difference in size between the display openings PD-OP of the pixel definition layer PDL.

As shown in FIG. 6C, the first area UA-N may include the first, second, and third light emitting areas PN-G, PN-R, and PN-B and the first non-light-emitting area NPXA1 surrounding first, second, and third light emitting areas PN-G, PN-R, and PN-B. The display openings PD-OP included in the first area UA-N may define the first, second, and third light emitting areas PN-G, PN-R, and PN-B having different sizes from each other. In the first area UA-N, an area between the first, second, and third light emitting areas PN-G, PN-R, and PN-B may be defined as the first non-light-emitting area NPXA1.

According to an embodiment, the pixel definition layer PDL may include an organic layer including a light blocking material. The pixel definition layer PDL may absorb a reflective light generated near the display opening PD-OP.

According to an embodiment, the support patterns SPP may be disposed on the pixel definition layer PDL. As an example, each of the support patterns SPP may be disposed on the pixel definition layer PDL disposed between the second light emitting area PN-R and the third light emitting area PN-B of the first area UA-N in a cross-section viewed from the first direction DR1.

The support patterns SPP may be formed in a local area through a separate patterning process after the pixel definition layer PDL is manufactured. The support patterns SPP may support a fine metal mask (FMM) defining a patterning area of the light emitting layer EML in the process of patterning the light emitting layer EML disposed on the first electrode AE and the pixel definition layer PDL.

Referring to FIG. 6D, the second area UA-P may include the first division patterns SP1. The first division patterns SP1 may be disposed on the first electrode AE exposed through the pixel definition layer PDL.

As an example, each of the first-first division patterns SP1-G may be disposed on the first electrode AE exposed through the display opening PD-OP that defines the fourth light emitting area PP-G (refer to FIG. 6A). Each of the first-second division patterns SP1-R may be disposed on the first electrode AE exposed through the display opening PD-OP that defines the fifth light emitting area PP-R (refer to FIG. 6A). Each of the first-third division patterns SP1-B may be disposed on the first electrode AE exposed through the display opening PD-OP that defines the sixth light emitting area PP-B (refer to FIG. 6A).

The first division patterns SP1 may divide the fourth, fifth, and sixth light emitting areas PP-G, PP-R, and PP-B (refer to FIG. 6A) into the fourth, fifth, and sixth sub-unit areas PU-G, PU-R, and PU-B, respectively. As an example, the fourth light emitting areas PP-G may be divided into the fourth sub-unit areas PU-G by the first-first division patterns SP1-G, the fifth light emitting areas PP-R may be divided into the fifth sub-unit areas PU-R by the first-second division patterns SP1-R, and the sixth light emitting areas PP-B may be divided into the sixth sub-unit areas PU-B by the first-third division patterns SP1-B.

According to an embodiment, each of the fourth sub-unit areas PU-G may have substantially the same width in one direction. For example, each of the first-first division patterns SP1-G may be disposed at a center of the first electrode AE exposed through the pixel definition layer PDL, and distances between both sides of each of the first-first division patterns SP1-G and the display opening PD-OP of the pixel definition layer PDL may be substantially the same as each other.

Each of the fifth sub-unit areas PU-R may have substantially the same width in one direction. For example, each of the first-second division patterns SP1-R may be disposed at a center of the first electrode AE exposed through the pixel definition layer PDL, and distances between both sides of each of the first-second division patterns SP1-R and the display opening PD-OP of the pixel definition layer PDL may be substantially the same as each other.

Each of the sixth sub-unit areas PU-B may have substantially the same width in one direction. For example, each of the first-third division patterns SP1-B may be disposed at a center of the first electrode AE exposed through the pixel definition layer PDL, and distances between both sides of each of the first-third division patterns SP1-B and the display opening PD-OP of the pixel definition layer PDL may be substantially the same as each other.

The second area UA-P may include the fourth, fifth, and sixth light emitting areas PP-G, PP-R, and PP-B (refer to FIG. 6A) and the second non-light-emitting area NPXA2 surrounding the fourth, fifth, and sixth light emitting areas PP-G, PP-R, and PP-B. In an embodiment, the fourth, fifth, and sixth light emitting areas PP-G, PP-R, and PP-B of the second area UA-P may include the fourth, fifth, and sixth sub-unit areas PU-G, PU-R, and PU-B, respectively. The second non-light-emitting area NPXA2 of the second area UA-P may include a first sub-non-light-emitting area N1 and a second sub-non-light-emitting area N2.

The first sub-non-light-emitting area N1 may be defined as an area between the fourth, fifth, and sixth light emitting areas PP-G, PP-R, and PP-B. The second sub-non-light-emitting area N2 may be defined as an area of the first electrode AE included in the light emitting elements OLED, which is covered by the first division patterns SP1. For example, the second sub-non-light-emitting area N2 may be defined as an area between the fourth, fifth, and sixth sub-unit areas PU-G, PU-R, and PU-B.

According to an embodiment, the active area AA of the display module DM may include the first area UA-N and the second area UA-P. For example, the second area UA-P may have an amount of a light, which is provided by the light emitting elements OLED, relatively smaller than that of the first area UA-N.

In an embodiment, one of the first, second, and third light emitting areas PN-G, PN-R, and PN-B included in the first area UA-N may be defined as a normal area, and one of the fourth, fifth, and sixth light emitting areas PP-G, PP-R, and PP-B included in the second area UA-P may be defined as a private area.

The input sensor ISL may be disposed directly on the thin film encapsulation layer TFL. The mesh lines (refer to FIG. 5B) included in the second conductive layer TML2 of the input sensor ISL may define the mesh openings MSL-OP. The mesh openings MSL-OP may overlap the light emitting areas, and thus, an interference between the conductive layers TML1 and TML2 and the light provided from the light emitting elements OLED may be reduced even though the conductive layers TML1 and TML2 are disposed directly on the display panel DP.

The light blocking layer PVL may be disposed on the input sensor ISL. According to an embodiment, the light blocking layer PVL may include the first planarization layer PVX1, the light blocking pattern BM, and the second planarization layer PVX2.

The first planarization layer PVX1 may cover the input sensor ISL. The first planarization layer PVX1 may provide a flat surface. The first planarization layer PVX1 may include an organic material. As an example, the first planarization layer PVX1 may include an acrylic resin.

The light blocking pattern BM may be disposed on the first planarization layer PVX1. The light blocking pattern BM may have a predetermined color. As an example, the light blocking pattern BM may have a black color. The light blocking pattern BM should not be particularly limited as long as the light blocking pattern BM may include a light blocking material for absorbing the light.

The light blocking pattern BM may overlap the pixel definition layer PDL disposed in the first area UA-N and the pixel definition layer PDL disposed in the second area UA-P. In addition, the light blocking pattern BM may overlap the first division patterns SP1 in the second area UA-P.

Accordingly, the light provided from the fourth, fifth, and sixth light emitting areas PP-G, PP-R, and PP-B of the second area UA-P may be provided to the user at a viewing angle narrower than a viewing angle of the light provided from the first, second, and third light emitting areas PN-G, PN-R, and PN-B of the first area UA-N by the light blocking pattern BM.

The second planarization layer PVX2 may be disposed on the first planarization layer PVX1 to cover the light blocking pattern BM. The second planarization layer PVX2 may provide a flat surface such that components disposed thereon are easily attached thereto. The second planarization layer PVX2 may include an organic material. As an example, the second planarization layer PVX2 may include an acrylic resin. According to an embodiment, the second planarization layer PVX2 may include the same material as that of the first planarization layer PVX1.

The display module DM according to an embodiment may be operated in two operation modes, e.g., first and second operation modes. The first operation mode may be defined as a state in which the first pixel PU-N and the second pixel PU-P included in the active area AA of the display module DM are activated, and the second operation mode may be defined as a state in which the first pixel PU-N is inactivated and only the second pixel PU-P is activated.

For example, during the first operation mode, the light may be provided from the first, second, and third light emitting areas PN-G, PN-R, and PN-B included in the first area UA-N and the fourth, fifth, and sixth light emitting areas PP-G, PP-R, and PP-B included in the second area UA-P, and during the second operation mode, the light may be provided from the fourth, fifth, and sixth light emitting areas PP-G, PP-R, and PP-B included in the second area UA-P.

Accordingly, the size of the activated light emitting areas in the second operation mode may be smaller than the size of the activated light emitting areas in the first operation mode, and thus, low resolution pixel images may be provided to the user.

The first operation mode may correspond to a mode in which the display device DD (refer to FIG. 1A) is normally operated. The second operation mode may be used when the display device DD is used for a specific purpose. As an example, the second operation mode may correspond to the private mode. When the display device DD is operated in the second operation mode, the active area AA may not be visible to people around the display device DD and may be visible only to the user, and thus, user's personal information may be prevented from being exposed.

When the user sees the display device DD at a side portion, the fourth, fifth, and sixth light emitting areas PP-G, PP-R, and PP-B disposed in the second area UA-P may be partially covered by the first division patterns SP1, and the light emitted from the pixel PX may be blocked by the light blocking patterns BM disposed on the first division patterns SP1. As a result, the viewing angle of the display device DD may be narrowed.

According to an embodiment, the pixel definition layer PDL may include the organic layer including the light blocking material. The reflectance of the external light may be reduced compared to a case where the pixel definition layer PDL does not include a separate light blocking material.

TABLE 1

| | PDL (not including light blocking material) + POL Ref | PDL (including light blocking material) + POL Ref |
|---|---|---|
| Reflectance in SCI mode (%) | 4.97 | 4.65 |
| Reflectance in SCE mode (%) | 0.60 | 0.23 |

Table 1 shows results of measuring the reflectance of the external light for the embodiment example in which the light blocking material is included in the pixel definition layer PDL and the comparative example in which the pixel definition layer PDL does not include a separate light blocking material. In this measurement process, a polarization film having a transmittance of about 50% is used as the optical member POL.

The specular component included (SCI) mode means that the measurement is carried out for a total amount of the reflected light including both specular and diffusely reflected lights. In a case where the pixel definition layer PDL that does not include the light blocking material is used, the reflectance of the external light is about 4.97%, and in a case where the pixel definition layer PDL that includes the light blocking material is used, the reflectance of the external light is about 4.65%. Accordingly, when the pixel definition layer PDL that includes the light blocking material is used, the reflectance measured in the SCI mode is reduced compared with the reflectance measured when the pixel definition layer PDL that does not include the light blocking material is used.

The specular component excluded (SCE) mode means that the measurement is carried out for an amount of the diffusely reflected light after removing the specular reflected light. In a case where the pixel definition layer PDL that does not include the light blocking material is used, the reflectance of the external light is about 0.60%, and in a case where the pixel definition layer PDL that includes the light blocking material is used, the reflectance of the external light is about 0.23%. Accordingly, when the pixel definition layer PDL that includes the light blocking material is used, the reflectance measured in the SCE mode is reduced compared with the reflectance measured when the pixel definition layer PDL that does not include the light blocking material is used.

For example, it is observed from the measurement values in Table 1 that the display device DD absorbs the reflected light generated near the pixel definition layer PDL and reduces the reflectance with respect to the external light. In addition, it is observed that the display device DD may have an effect of reducing the reflectance with respect to each of the specular and diffusely reflected lights.

According to an embodiment, the first division patterns SP1 disposed in the second area UA-P may be formed together with the support patterns SPP (refer to FIG. 6A) disposed in the first area UA-N. For example, as the first division patterns SP1 are patterned in the process of patterning the support patterns SPP, each of the fourth, fifth, and sixth light emitting areas PP-G, PP-R, and PP-B of the second area UA-P may be divided into corresponding sub-unit areas among the fourth, fifth, and sixth sub-unit areas PU-G, PU-R, and PU-B.

According to an embodiment, since process variation occurring in the pixel definition layer PDL including the light blocking material is high during the patterning process, it is difficult to divide each of the fourth, fifth, and sixth light emitting areas PP-G, PP-R, and PP-B into the corresponding sub-unit areas among the fourth, fifth, and sixth sub-unit areas PU-G, PU-R, and PU-B, by patterning the pixel definition layer PDL.

According to an embodiment, the fourth, fifth, and sixth sub-unit areas PU-G, PU-R, and PU-B may be defined by the first division patterns SP1 that are patterned and formed together with the support patterns SPP. Since the support patterns SPP has a higher deposition precision than that of the pixel definition layer PDL including the light blocking material, the fourth, fifth, and sixth sub-unit areas PU-G, PU-R, may be PU-B may be precisely divided. Accordingly, the display device DD may have improved deposition reliability with respect to a pixel area.

Figure 7A:
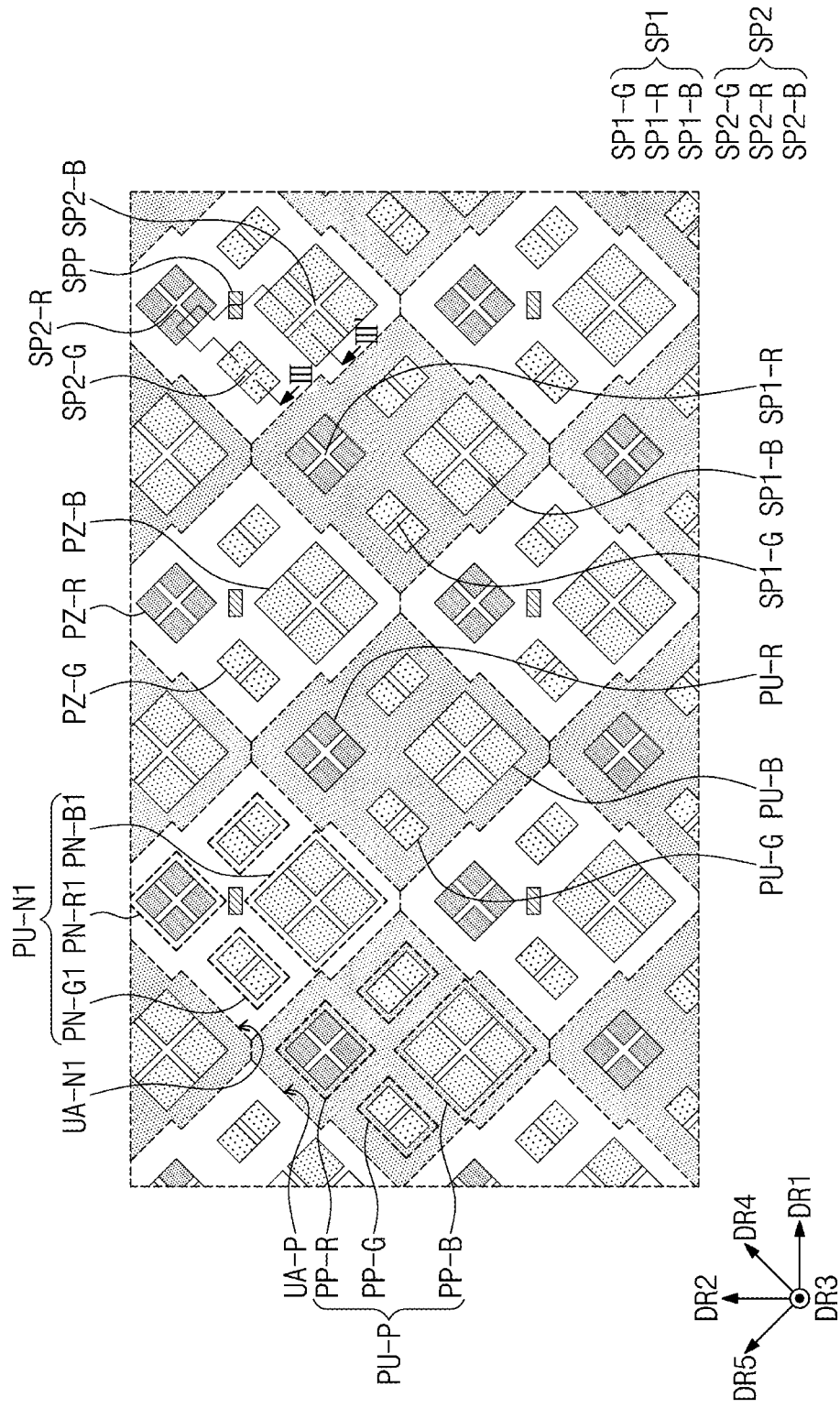
FIG. 7A is a plan view of another embodiment of the active area of the display module of FIG. 1B.
Figure 7B:
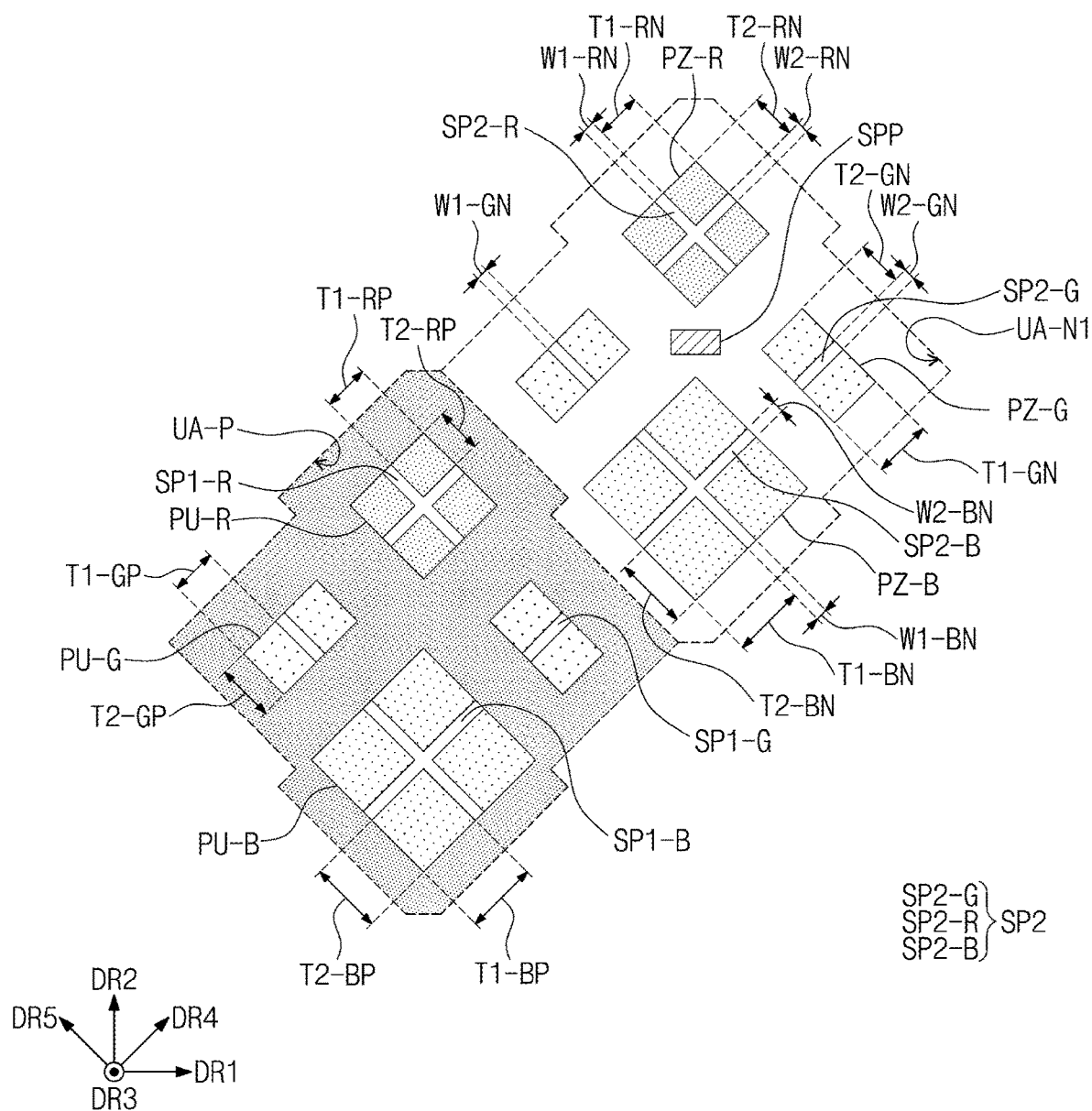
FIG. 7B is an enlarged plan view of a portion of the active area of FIG. 7A.
Figure 7C:
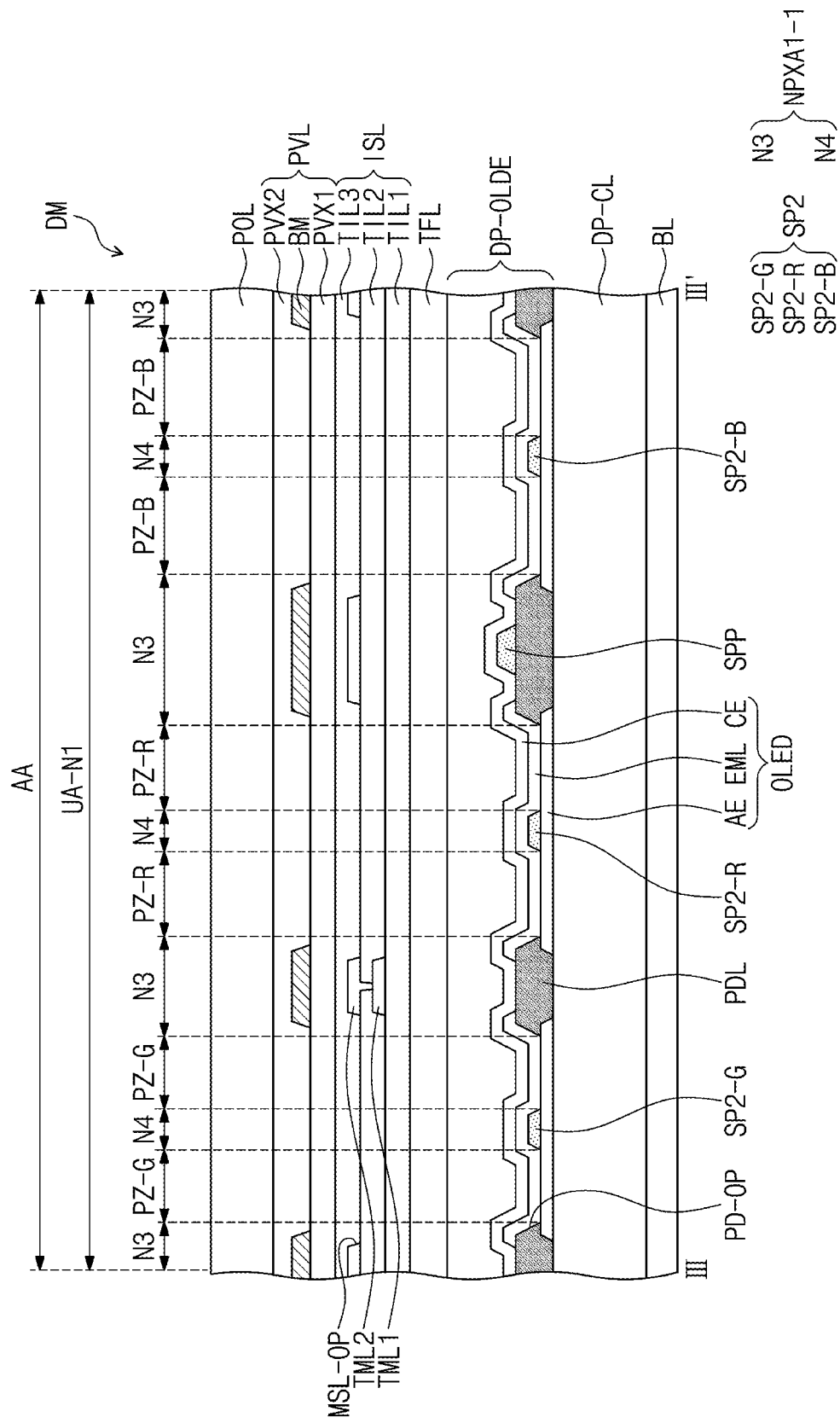
FIG. 7C is a cross-sectional view taken along a line of FIG. 7A.

FIG. 7A is a plan view showing an active area according to an embodiment. FIG. 7B is an enlarged plan view showing a portion of the active area according to an embodiment. FIG. 7C is a cross-sectional view taken along a line III-III' of FIG. 7A to show a display module. In FIGS. 7A and 7B, descriptions on a second pixel PU-P included in a second area UA-P, i.e., fourth, fifth, and sixth light emitting areas PP-G, PP-R, and PP-B, and fourth, fifth, and sixth sub-unit areas PU-G, PU-R, and PU-B included in the second area UA-P are substantially the same as those described with reference to FIGS. 1 to 6D, and first, second, and third light emitting areas PN-G1, PN-R1, and PN-B1 disposed in a first area UA-N1 will be mainly described.

Referring to FIG. 7A, the active area AA (refer to FIG. 1B) of the display module DM (refer to FIG. 1B) may include the first area UA-N1 and the second area UA-P.

Each of the first, second, and third light emitting areas PN-G1, PN-R1, and PN-B1 included in the first area UA-N1 may include at least one sub-unit areas PZ-G, PZ-R, and PZ-B. The sub-unit areas PZ-G, PZ-R, and PZ-B may include first sub-unit areas PZ-G included in the first light emitting area PN-G1, second sub-unit areas PZ-R included in the second light emitting area PN-R1, and third sub-unit areas PZ-B included in the third light emitting area PN-B1.

According to an embodiment, the number of the first, second, and third sub-unit areas PZ-G, PZ-R, and PZ-B respectively included in the first, second, and third light emitting areas PN-G1, PN-R1, and PN-B1 of the first area UA-N1 may correspond to the number of the fourth, fifth, and sixth sub-unit areas PU-G, PU-R, and PU-B respectively included in the fourth, fifth, and sixth light emitting areas PP-G, PP-R, and PP-B included in the second area UA-P.

As an example, each of the first light emitting areas PN-G1 included in the first area UA-N1 may include two first sub-unit areas PZ-G. In the first area UA-N1, two first sub-unit areas included in one first light emitting area may be arranged in the fourth direction DR4, and two first sub-unit areas included in the other first light emitting area may be arranged in the fifth direction DR5.

The second light emitting area PN-R1 may include four second sub-unit areas PZ-R. The four second sub-unit areas PZ-R may be arranged in two rows by two columns with respect to the fourth direction DR4 or the fifth direction DR5.

The third light emitting area PN-B1 may include four third sub-unit areas PZ-B. The four third sub-unit areas PZ-B may be arranged in two rows by two columns with respect to the fourth direction DR4 or the fifth direction DR5.

According to an embodiment, the first area UA-N1 may include second division patterns SP2. The second division patterns SP2 may be disposed between the first, second, and third sub-unit areas PZ-G, PZ-R, and PZ-B. The second division patterns SP2 may include second-first division patterns SP2-G, second-second division patterns SP2-R, and second-third division patterns SP2-B.

As an example, each of the second-first division patterns SP2-G may be disposed in a corresponding first sub-unit area among the first sub-unit areas PZ-G. As an example, one first division pattern of the first area UA-N1 may be disposed between two first sub-unit areas arranged in the fourth direction DR4 and may have a rectangular shape extending in the fifth direction DR5. The other first division pattern of the first area UA-N1 may be disposed between two first sub-unit areas arranged in the fifth direction DR5 and may have a rectangular shape extending in the fourth direction DR4.

Each of the second-second division patterns SP2-R may be disposed between four second sub-unit areas PZ-R. Each of the second-second division patterns SP2-R may extend in the fourth direction DR4 and the fifth direction DR5 and may have a cross shape.

Each of the second-third division patterns SP2-B may be disposed between four third sub-unit areas PZ-B. Each of the second-third division patterns SP2-B may extend in the fourth direction DR4 and the fifth direction DR5 and may have a cross shape.

Referring to FIG. 7B, each of the first sub-unit areas PZ-G may include a second-first sub-unit side T1-GN extending in the fourth direction DR4 and a second-second sub-unit side T2-GN extending in the fifth direction DR5. Each of the second sub-unit areas PZ-R may include a second-third sub-unit side T1-RN extending in the fourth direction DR4 and a second-fourth sub-unit side T2-RN extending in the fifth direction DR5. Each of the third sub-unit areas PZ-B may include a second-fifth sub-unit side T1-BN extending in the fourth direction DR4 and a second-sixth sub-unit side T2-BN extending in the fifth direction DR5.

A width in one direction of each of the first, second, and third sub-unit areas PZ-G, PZ-R, and PZ-B of the first area UA-N1 may be substantially the same as a width in the one direction of each of the fourth, fifth, and sixth sub-unit areas PU-G, PU-R, and PU-B of the second area UA-P.

As an example, the second-first sub-unit side T1-GN of the first sub-unit area PZ-G may have substantially the same width as that of a first-first sub-unit side T1-GP of the second area UA-P, and the second-second sub-unit side T2-GN may have substantially the same width as that of a first-second sub-unit side T2-GP of the second area UA-P in the fifth direction DR5.

The second-third sub-unit side T1-RN of the second sub-unit area PZ-R may have substantially the same width as that of a first-third sub-unit side T1-RP of the second area UA-P, and the second-fourth sub-unit side T2-RN may have substantially the same width as that of a first-fourth sub-unit side T2-RP of the second area UA-P.

The second-fifth sub-unit side T1-BN of the sixth sub-unit area PZ-B may have substantially the same width as that of a first-fifth sub-unit side T1-BP of the second area UA-P, and the second-sixth sub-unit side T2-BN may have substantially the same width as that of a first-sixth sub-unit side T2-BP of the second area UA-P.

Accordingly, a size of each of the first sub-unit areas PZ-G may be substantially the same as a size of each of the fourth sub-unit areas PU-G, a size of each of the second sub-unit areas PZ-R may be substantially the same as a size of each of the fifth sub-unit areas PU-R, and a size of each of the third sub-unit areas PZ-B may be substantially the same as a size of each of the sixth sub-unit areas PU-B.

The second-first division patterns SP2-G may include a short side extending in the fourth direction DR4 or a short side extending in the fifth direction DR5, the short side extending in the fourth direction DR4 may have a second-first division width W1-GN, and the short side extending in the fifth direction DR5 may have a second-second division width W2-GN.

Each of the second-second division patterns SP2-R may have a second-third division width W1-RN extending in the fourth direction DR4 between the second sub-unit areas PZ-R and a second-fourth division width W2-RN extending in the fifth direction DR5 between the second sub-unit areas PZ-R.

Each of the second-third division patterns SP2-B may have a second-fifth division width W1-BN extending in the fourth direction DR4 between the third sub-unit areas PZ-B and a second-sixth division width W2-BN extending in the fifth direction DR5 between the third sub-unit areas PZ-B.

According to an embodiment, the second-first and second-second division widths W1-GN and W2-GN of the second-first division patterns SP2-G may be substantially the same as the second-third and second-fourth division widths W1-RN and W2-RN of the second-second division patterns SP2-R and the second-fifth and second-sixth division widths W1-BN and W2-BN of the second-third division patterns SP2-B.

However, embodiments are not limited thereto or thereby, the widths of the second division patterns SP2 may be set differently for each light emitting area, and thus, the sizes of the sub-unit areas may be controlled.

In the first area UA-N1, the size of the first light emitting area PN-G1 may be defined as a sum of the sizes of the first sub-unit areas PZ-G, the size of the second light emitting area PN-R1 may be defined as a sum of the sizes of the second sub-unit areas PZ-R, and the size of the third light emitting areas PN-B1 may be defined as a sum of the sizes of the third sub-unit areas PZ-B.

In an embodiment, the sizes of the first, second, and third light emitting areas PN-G1, PN-R1, and PN-B1 of the first area UA-N1 may be substantially the same as the sizes of the fourth, fifth, and sixth light emitting areas PP-G, PP-R, and PP-B of the second area UA-P, respectively. Accordingly, a driving voltage required to allow the first, second, and third light emitting areas PN-G1, PN-R1, and PN-B1 of the first area UA-N1 to emit the lights may be substantially the same as a driving voltage required to allow the fourth, fifth, and sixth light emitting areas PP-G, PP-R, and PP-B of the second area UA-P to emit the lights.

Referring to FIG. 7C, the first area UA-N1 may include the second division patterns SP2. The second division patterns SP2 may divide the first, second, and third light emitting areas PN-G1, PN-R1, and PN-B1 (refer to FIG. 7A) into corresponding sub-unit areas among the first, second, and third sub-unit areas PZ-G, PZ-R, and PZ-B.

As an example, each of the first light emitting areas PN-G1 (refer to FIG. 7A) may be divided into the first sub-unit areas PZ-G by the second-first division patterns SP2-G, each of the second light emitting areas PN-B1 (refer to FIG. 7A) may be divided into the second sub-unit areas PZ-R by the second-second division patterns SP2-R, and each of the third light emitting areas PN-B1 (refer to FIG. 7A) may be divided into the third sub-unit areas PZ-B by the second-third division patterns SP2-B.

In the first area UA-N1, each of the second-first division patterns SP2-G may be disposed on a first electrode AE exposed through a display opening PD-OP defining the first light emitting area PN-G1. Each of the second-second division patterns SP2-R may be disposed on the first electrode AE exposed through the display opening PD-OP defining the second light emitting area PN-R1. Each of the second-third division patterns SP2-B may be disposed on the first electrode AE exposed through the display opening PD-OP defining the third light emitting area PN-B1.

The first non-light-emitting area NPXA1 of the first area UA-N1 may include the third sub-non-light-emitting area N3 and the fourth sub-non-light-emitting area N4. The third sub-non-light-emitting area N3 may be defined as an area between the first, second, and third light emitting areas PN-G1, PN-R1, and PN-B1. The fourth sub-non-light-emitting area N4 may be defined as an area of the first electrode AE included in the light emitting elements OLED, which is covered by the second division patterns SP2.

According to an embodiment, the second division patterns SP2 may be formed together with support patterns SPP. For example, the second division patterns SP2 may be patterned in the process of patterning the support patterns SPP to divide the first, second, and third light emitting areas PN-G1, PN-R1, and PN-B1 of the first area UA-N1 into the corresponding sub-unit areas among the first, second, and third sub-unit areas PZ-G, PZ-R, and PZ-B. As the second division patterns SP2 may be formed of a material with low process variation, the first, second, and third sub-unit areas PZ-G, PZ-R, and PZ-B may be precisely divided, and thus, the process reliability of the display device DD (refer to FIG. 1A) may be improved.

According to an embodiment, the light blocking pattern BM may overlap only the pixel definition layer PDL except the second division patterns SP2 (e.g., SP2-G, SP2-R, and SP2-B) in the first area UA-N1. Accordingly, although the first, second, and third light emitting areas PN-G1, PN-R1, and PN-B1 are divided into corresponding second division patterns SP2 (e.g., SP2-G, SP2-R, and SP2-B) in the first area UA-N1, the viewing angle of the first area UA-N1 may not be reduced since the light blocking pattern BM is not disposed on the second division patterns SP2 (e.g., SP2-G, SP2-R, and SP2-B).

For example, a cross-section of the second area UA-P may correspond to the cross-section described with reference to FIG. 6C.

Figure 8A:
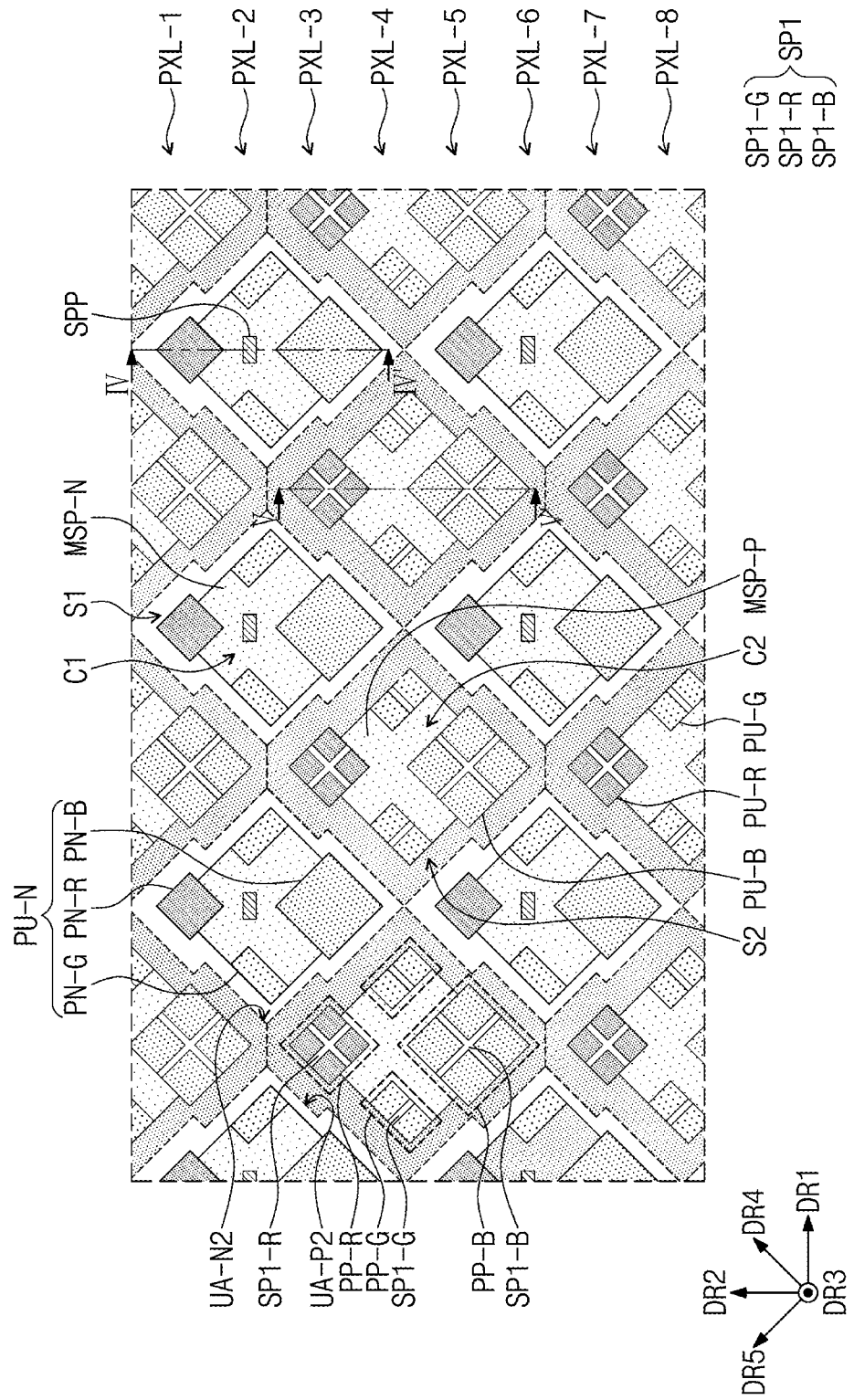
FIG. 8A is a plan view of another embodiment of the active area of the display module of FIG. 1B.
Figure 8B:
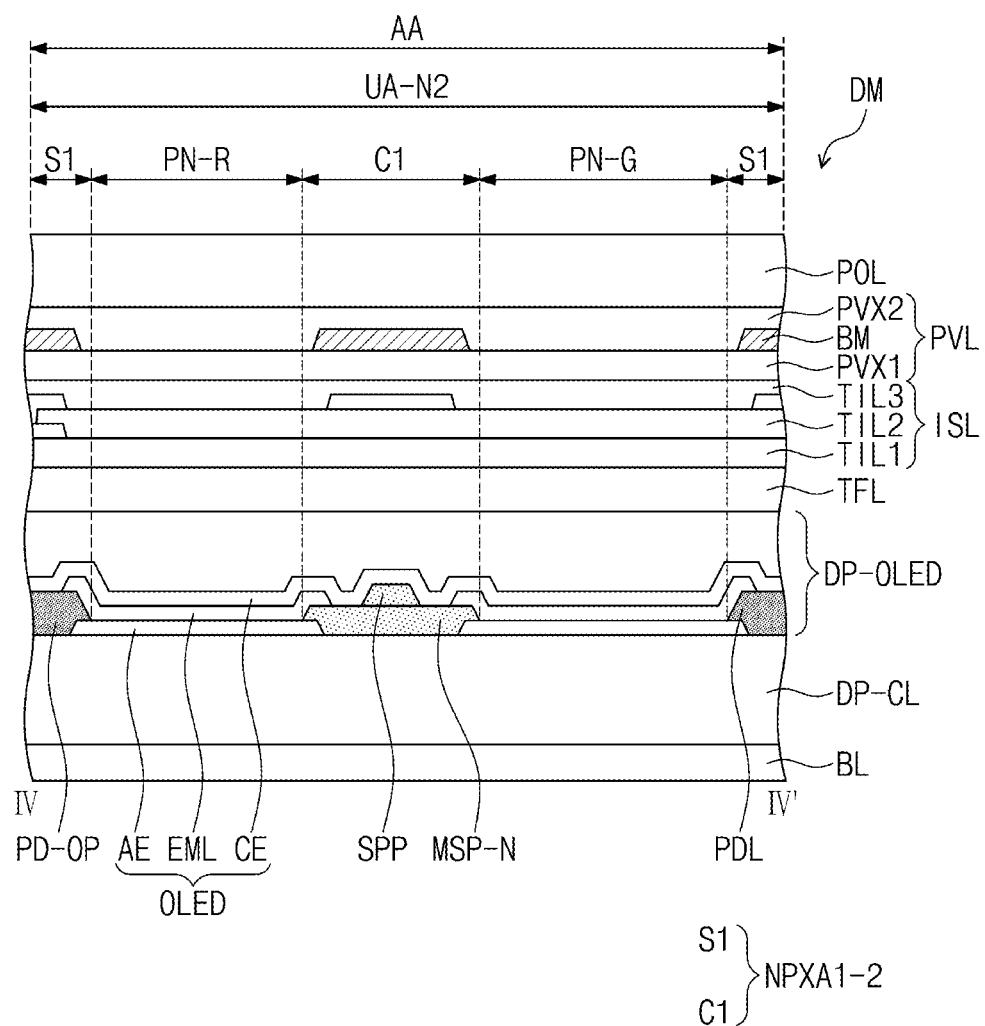
FIG. 8B is a cross-sectional view taken along a line IV-IV' of FIG. 8A.
Figure 8C:
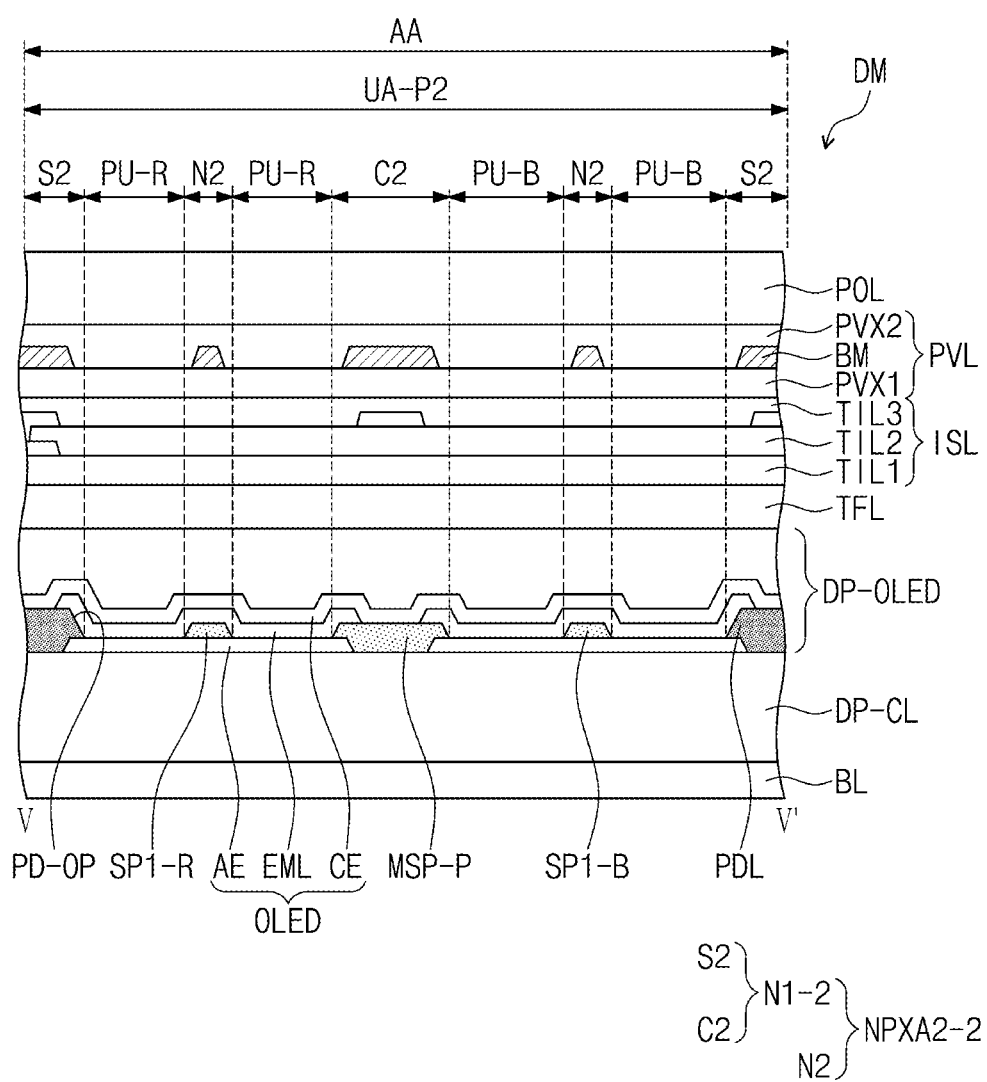
FIG. 8C is a cross-sectional view taken along a line V-V' of FIG. 8A.

FIG. 8A is a plan view showing an active area according to an embodiment. FIG. 8B is a cross-sectional view taken along a line IV-IV' of FIG. 8A to show a display module DM. FIG. 8C is a cross-sectional view taken along a line V-V' of FIG. 8A to show the display module. The display module DM shown in FIGS. 8A to 8C may further include a first center division pattern MSP-N disposed in a first area UA-N2 and a second center division pattern MSP-P disposed in a second area UA-P2 when compared with the display module DM described with reference to FIG. 6A.

Referring to FIG. 8A, the first area UA-N2 may include first, second, and third light emitting areas PN-G, PN-R, and PN-B and the first non-light-emitting area NPXA1-2 surrounding the first, second, and third light emitting areas PN-G, PN-R, and PN-B. The first non-light-emitting area NPXA1-2 of the first area UA-N2 may include first peripheral areas S1 and first center areas C1.

Each of the first peripheral areas S1 may surround the first, second, and third light emitting areas PN-G, PN-R, and PN-B. As an example, each of the first peripheral areas S1 may surround sides of each of the first, second, and third light emitting areas PN-G, PN-R, and PN-B, which face the second area UA-P2 adjacent thereto. Each of the first center areas C1 may be defined as an area that is surrounded by the first, second, and third light emitting areas PN-G, PN-R, and PN-B and the first peripheral areas S1.

According to an embodiment, the first area UA-N2 may include the first center division patterns MSP-N. The first center division patterns MSP-N may entirely overlap the first center areas C1.

FIG. 8A shows a structure in which a boundary of the first center division patterns MSP-N is aligned with portions of a long side and a short side adjacent to the support pattern SPP of each of the second light emitting areas PN-R and is aligned with portions of a long side and a short side adjacent to the support pattern SPP of each of the third light emitting areas PN-B as a representative example, however, embodiments are not limited thereto or thereby. According to an embodiment, the boundary of the first center division pattern MSP-N may be disposed to be aligned with entire portions of the long side and the short side of each of the second and third light emitting areas PN-R and PN-B.

According to an embodiment, the second area UA-P2 may include fourth, fifth, and sixth light emitting areas PP-G, PP-R, and PP-B, the second non-light-emitting area NPXA2-2 including a first sub-non-light-emitting area N1-2 surrounding the fourth, fifth, and sixth light emitting areas PP-G, PP-R, and PP-B, and a second sub-non-light-emitting area N2 disposed between first, second, and third sub-unit areas PZ-G, PZ-R, and PZ-B.

The first sub-non-light-emitting area N1-2 may include second peripheral areas S2 and second center areas C2. Each of the second peripheral areas S2 may be defined as an area surrounding the fourth, fifth, and sixth light emitting areas PP-G, PP-R, and PP-B. As an example, each of the second peripheral areas S2 may be defined as an area surrounding sides of each of the fourth, fifth, and sixth light emitting areas PP-G, PP-R, and PP-B, which face the first area UA-N2 adjacent thereto. Each of the second center areas C2 may be defined as an area that is surrounded by the fourth, fifth, and sixth light emitting areas PP-G, PP-R, and PP-B and the second peripheral areas S2.

According to an embodiment, the second area UA-P2 may include second center division patterns MSP-P. The second center division patterns MSP-P may entirely overlap the second center area C2.

FIG. 8A shows a structure in which a boundary of each of the second center division patterns MSP-P is aligned with portions of a long side and a short side adjacent to the support portion among long sides and short sides of each of the fifth light emitting areas PP-R and is aligned with portions of a long side and a short side adjacent to the support pattern of the sixth light emitting areas PP-B as a representative example, however, embodiments are not limited thereto or thereby. According to an embodiment, the boundary of the second center division patterns MSP-P may be disposed to be aligned with entire portions of the long side and the short side of each of the fifth and sixth light emitting areas PP-R and PP-B.

In an embodiment, the second center division patterns MSP-P are illustrated separately from the first division patterns SP1 in the second area UA-P2, however, this is merely for convenience of explanation about the differences between the embodiments, and they may correspond to components that are substantially simultaneously and integrally formed.

Referring to FIG. 8B, in the first area UA-N2, each of the second and third light emitting areas PN-R and PN-B may be defined by a pixel definition layer PDL and the first center division patterns MSP-N. FIG. 8B shows only the cross-section of the second and third light emitting areas PN-R and PN-B, however, the cross-sectional structure may also be applied to the first light emitting area PN-G (refer to FIG. 8A). For example, the first light emitting areas PN-G may also be defined by the pixel definition layer PDL and the first center division patterns MSP-N.

As an example, in the cross-section viewed from the first direction DR1, one end of a first electrode AE defining the second light emitting area PN-R may be exposed by the pixel definition layer PDL, and the other end of the first electrode AE may be exposed by the first center division pattern MSP-N. One end of the first electrode AE defining the third light emitting area PN-B may be exposed by the pixel definition layer PDL, and the other end of the first electrode AE may be exposed by the first center division pattern MSP-N.

According to an embodiment, the support patterns SPP may be disposed on the first center division patterns MSP-N. The first center division patterns MSP-N may be formed together with the support patterns SPP. For example, the first center division patterns MSP-N to define portions of the first, second, and third light emitting areas PN-G, PN-R, and PN-B of the first area UA-N2 may be patterned together with the support patterns SPP in the process of patterning the support patterns SPP.

Accordingly, each of the support patterns SPP may correspond to a portion protruded upward from the first center division patterns MSP-N to form a step difference with the first center division pattern MSP-N. In an embodiment, for the convenience of explanation, the support patterns SPP are illustrated separately from the first center division patterns MSP-N, however, they may correspond to components that are substantially integrally formed with each other.

According to an embodiment, a light blocking pattern BM may be disposed to overlap the pixel definition layer PDL and the first center division patterns MSP-N in the first area UA-N2. For example, the light blocking pattern BM may be disposed to overlap the first peripheral area S1 and the first center area C1 in the first area UA-N2.

Referring to FIG. 8C, each of the fifth and sixth sub-unit areas PU-R and PU-B may be defined by the pixel definition layer PDL and the second center division pattern MSP-P in the second area UA-P2. FIG. 8C shows only the cross-section of the fifth and sixth sub-unit areas PU-R and PU-B, however, the cross-sectional structure may also be applied to the fourth sub-unit PU-G (refer to FIG. 8A). For example, the fourth sub-unit areas PU-G may also be defined by the pixel definition layer PDL and the second center division pattern MSP-P in the second area UA-P2.

As an example, in the cross-section viewed from the first direction DR1, one end of the first electrode AE defining the fifth sub-unit area PU-R may be exposed by the pixel definition layer PDL, and the other end of the first electrode AE may be exposed by the second center division pattern MSP-P. One end of the first electrode AE defining the sixth sub-unit area PU-B may be exposed by the pixel definition layer PDL, and the other end of the first electrode AE may be exposed by the second center division pattern MSP-P. According to an embodiment, the light blocking pattern BM may be disposed to overlap the pixel definition layer PDL, the second center division pattern MSP-P, and the first division patterns SP1 in the second area UA-P2. For example, the light blocking pattern BM may be disposed to overlap the second peripheral areas S2, the second center areas C2, and the second sub-non-light-emitting area N2 of the second area UA-P2.

Accordingly, a viewing angle of the light provided from the fourth, fifth, and sixth sub-unit areas PU-G, PU-R, and PU-B of the second area UA-P2 may be narrower than a viewing angle of the light provided from the fourth, fifth, and sixth sub-unit areas PU-G, PU-R, and PU-B of the first area UA-N2 by the light blocking pattern BM disposed to overlap the first division patterns SP1.

Figure 9A:
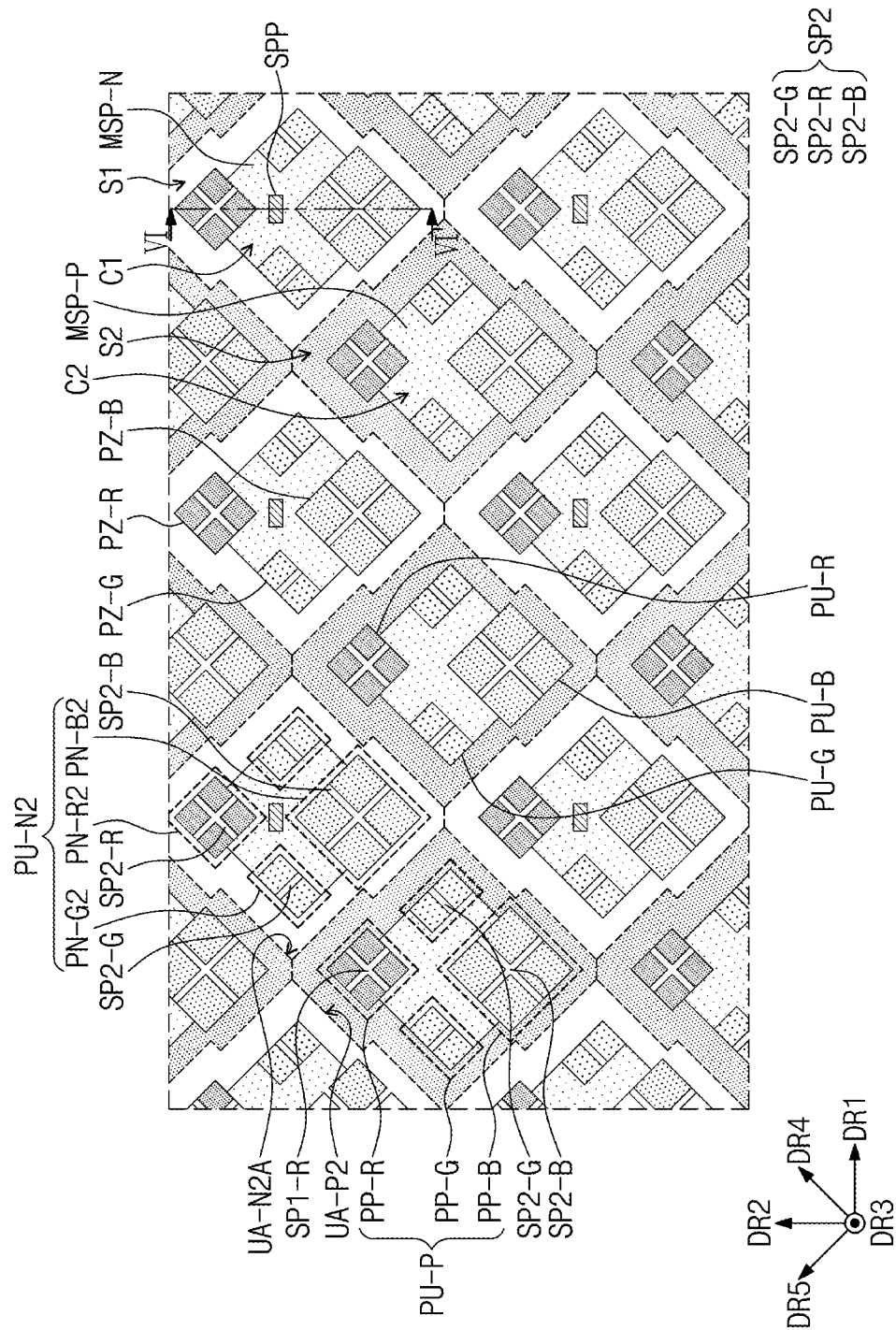
FIG. 9A is a plan view of another embodiment of the active area of the display module of FIG. 1B.
Figure 9B:
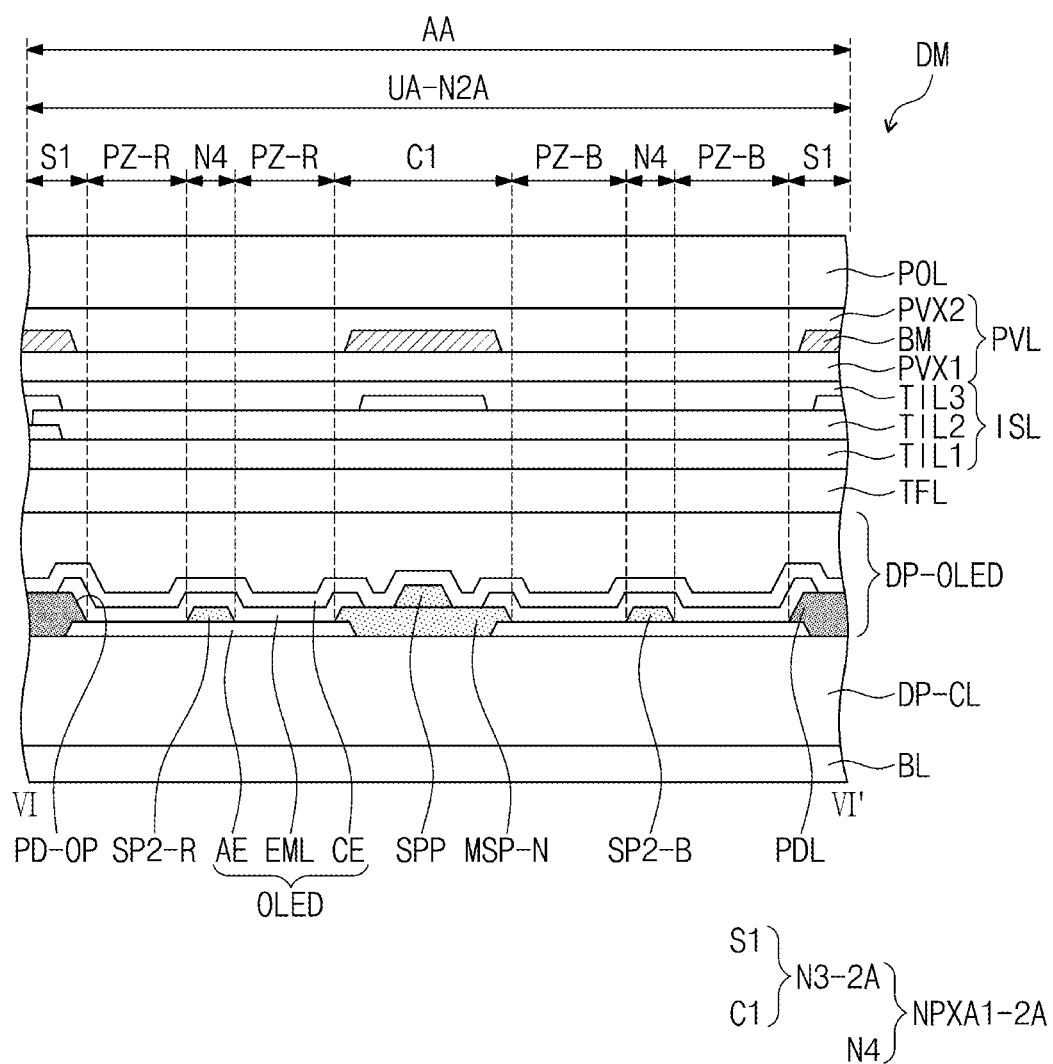
FIG. 9B is a cross-sectional view taken along a line VI-VI' of FIG. 9A.

FIG. 9A is a plan view showing an active area according to an embodiment. FIG. 9B is a cross-sectional view taken along a line VI-VI' of FIG. 9A to show a display module. Descriptions on a plurality of fourth, fifth, and sixth light emitting areas PP-G, PP-R, and PP-B and a plurality of fourth, fifth, and sixth sub-unit areas PU-G, PU-R, and PU-B of a second pixel PU-P included in a second area UA-P2 of FIGS. 9A and 9B are the same as those described with reference to FIGS. 8A and 8C. Accordingly, in FIGS. 9A and 9B, first, second, and third light emitting areas PN-G2, PN-R2, and PN-B2 of a first pixel PU-N2 included in a first area UA-N2A will be mainly described for descriptive convenience.

Referring to FIG. 9A, the active area AA (refer to FIG. 1B) of the display module DM (refer to FIG. 1A) may include the first area UA-N2A and the second area UA-P2.

According to an embodiment, the first, second, and third light emitting areas PN-G2, PN-R2, and PN-B2 included in the first area UA-N2A may include first, second, and third sub-unit areas PZ-G, PZ-R, and PZ-B, respectively. In addition, the first area UA-N2A may include a second division patterns SP2 disposed between the first, second, and third sub-unit areas PZ-G, PZ-R, and PZ-B. The second division patterns SP2 may include second-first division patterns SP2-G, second-second division patterns SP2-R, and second-third division patterns SP2-B. For example, a sum of sizes of the first sub-unit areas PZ-G of the first area UA-N2A is substantially equal to a sum of sizes of the fourth sub-unit areas PU-G of the second area UA-P2, a sum of sizes of the second sub-unit areas PZ-R of the first area UA-N2A is substantially equal to a sum of sizes of the fifth sub-unit areas PU-R of the second area UA-P2, and a sum of sizes of the third sub-unit areas PZ-B of the first area UA-N2A is substantially equal to a sum of sizes of the sixth sub-unit areas PU-B of the second area UA-P2.

Arrangements and shapes of the first, second, and third light emitting areas PN-G2, PN-R2, and PN-B2 and the second-first, second-second, and second-third division patterns SP2-G, SP2-R, and SP2-B are substantially the same as those of the first, second, and third light emitting areas PN-G1, PN-R1, and PN-B1 and the second-first, second-second, and second-third division patterns SP2-G, SP2-R, and SP2-B described with reference to FIGS. 7A and 7B, and thus, descriptions thereof will be omitted in FIGS. 9A and 9B for descriptive convenience.

According to an embodiment, a first non-light-emitting area NPXA1-2A of the first area UA-N2A may include a third sub-non-light-emitting area N3-2A and the fourth sub-non-light-emitting area N4. And, the third sub-non-light-emitting area N3-2A may include first peripheral areas S1 and first center areas C1. First center division patterns MSP-N may be disposed to entirely overlap the first center areas C1. For example, at least a portion of each of first, second, and third light emitting areas PN-G2, PN-R2, and PN-B2 of the first area UA-N2A may be defined by the first center division patterns MSP-N.

In an embodiment, the first center division patterns MSP-N are illustrated separately from the second division patterns SP2 in the first area UA-N2A, however, this is merely for convenience of explanation about the differences between the embodiments, and they may correspond to components that are substantially simultaneously and integrally formed.

Referring to FIG. 9B, each of the first, second, and third light emitting areas PN-G2, PN-R2, and PN-B2 (refer to FIG. 9A) may be defined by a pixel definition layer PDL and the first center division patterns MSP-N in the first area UA-N2A.

As an example, in the cross-section viewed from the first direction DR1, one end of a first electrode AE defining the second light emitting area PN-R2 may be covered by the pixel definition layer PDL, and the other end of the first electrode AE may be covered by the first center division pattern MSP-N. For example, a portion of a boundary of the second light emitting area PN-R2 may be defined by the pixel definition layer PDL, and the other portion of the boundary of the second light emitting area PN-R2 may be defined by the first center division pattern MSP-N.

One end of the first electrode AE defining the third light emitting area PN-B2 may be covered by the pixel definition layer PDL, and the other end of the first electrode AE may be covered by the first center division pattern MSP-N. For example, a portion of a boundary of the third light emitting area PN-B2 may be defined by the pixel definition layer PDL, and the other portion of the boundary of the third light emitting area PN-B2 may be defined by first center division pattern MSP-N. FIG. 9B shows only the cross-section of the second and third light emitting areas PN-R2 and PN-B2, however, the cross-sectional structure may also be applied to the first light emitting area PN-G2.

According to an embodiment, each of second-first, second-second, and second-third division patterns SP2-G, SP2-R, and SP2-B (refer to 9A) may be disposed on the first electrode AE exposed by the pixel definition layer PDL and the first center division pattern MSP-N. The second-first, second-second, and second-third division patterns SP2-G, SP2-R, and SP2-B may respectively divide the first, second, and third light emitting areas PN-G2, PN-R2, and PN-B2 into plural sub-unit areas, e.g., first, second, and third sub-unit areas PZ-G, PZ-R, and PZ-B.

According to an embodiment, a light blocking pattern BM may be disposed to overlap the pixel definition layer PDL and the first center division patterns MSP-N and may be disposed not to overlap the second division patterns SP2 (e.g., SP2-G, SP2-R, and SP2-B) in the first area UA-N2A. Accordingly, although the light emitting areas of the first area UA-N2A is partitioned, the viewing angle of the display module DM may not be reduced.

For example, a cross-sectional view of the second area UA-P2 may correspond to the cross-sectional view described with reference to FIG. 8C.

Figure 10A:
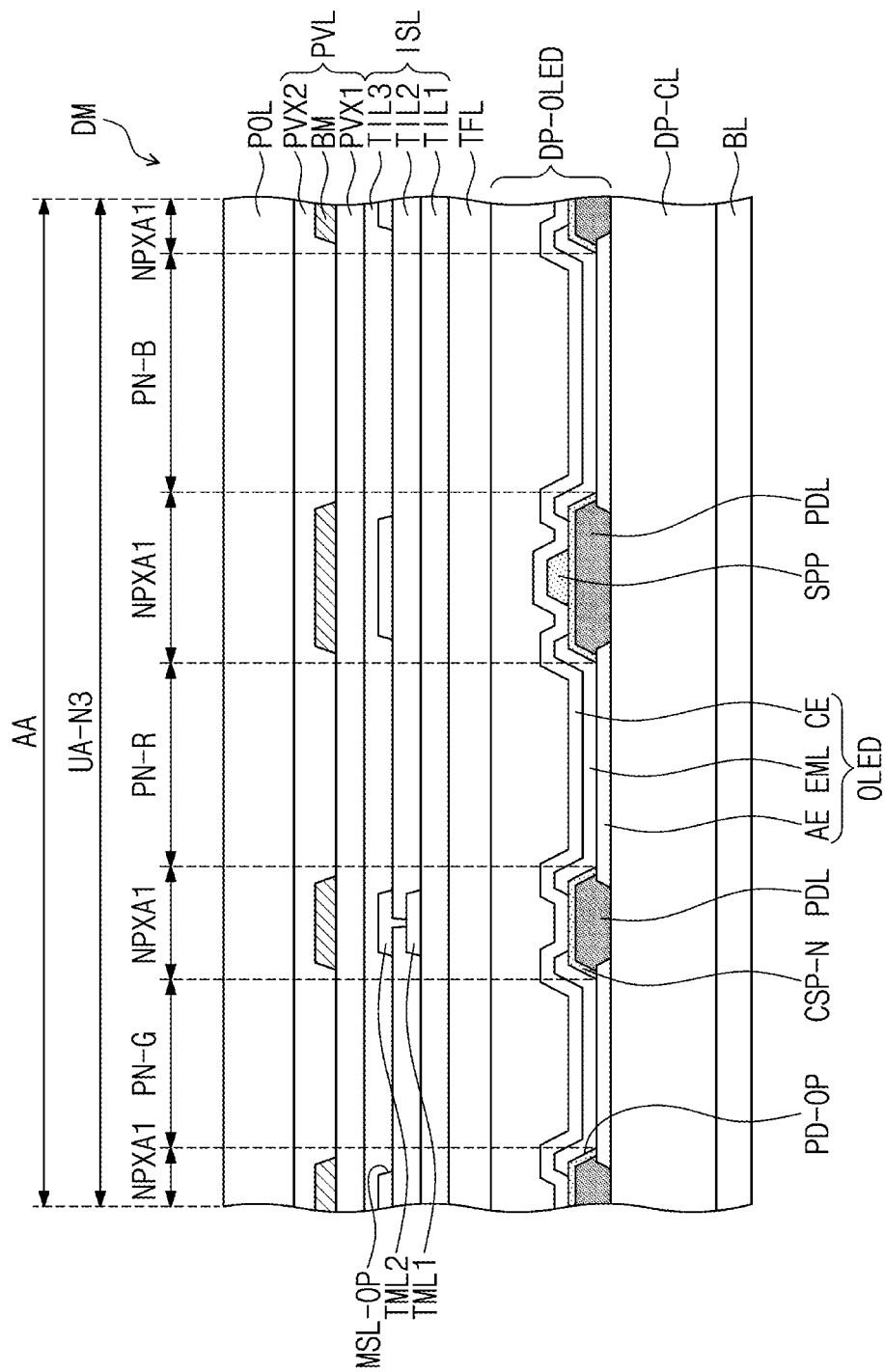
FIG. 10A is a cross-sectional view of another embodiment of the active area of the display module of FIG. 1B.
Figure 10B:
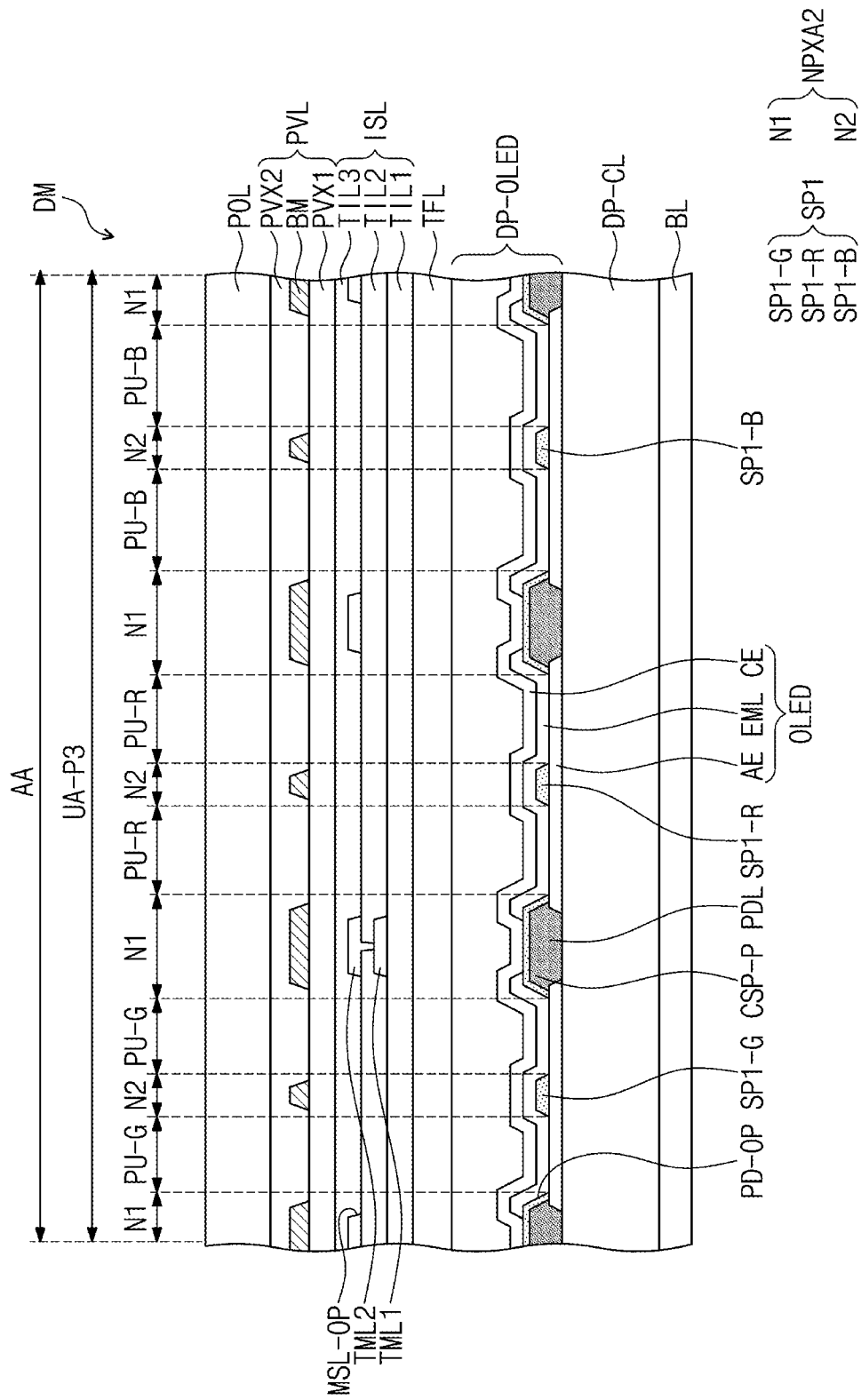
FIG. 10B is a cross-sectional view of another embodiment of the active area of the display module of FIG. 1B.

FIG. 10A is a cross-sectional view showing a display module DM (refer to FIG. 1B) according to an embodiment. FIG. 10B is a cross-sectional view showing the display module DM according to an embodiment. FIG. 10A shows a cross-section of a first area UA-N3 of the display module DM to show an example of the first area UA-N shown in FIG. 6A. FIG. 10B shows a cross-section of a second area UA-P3 of the display module DM to show an example of the second area UA-P shown in FIG. 6A.

Referring to FIG. 10A, the first area UA-N3 may further include first cover patterns CSP-N. The first cover patterns CSP-N may be disposed on a pixel definition layer PDL. The first cover patterns CSP-N may be provided in the form of a thin layer to cover the pixel definition layer PDL.

According to an embodiment, first, second, and third light emitting areas PN-G, PN-R, and PN-B included in the first area UA-N3 may be defined by the first cover patterns CSP-N covering the pixel definition layer PDL. Each of the first, second, and third light emitting areas PN-G, PN-R, and PN-B may be defined by the first cover pattern CSP-N disposed on a display opening PD-OP of a corresponding pixel definition layer PDL.

However, since the first cover patterns CSP-N may be provided in the form of a layer with a uniform thickness to cover the pixel definition layer PDL, the first, second, and third light emitting areas PN-G, PN-R, and PN-B may be substantially controlled by the display opening PD-OP included in the pixel definition layer PDL.

According to an embodiment, support patterns SPP may be disposed on the first cover patterns CSP-N. The support patterns SPP and the first cover patterns CSP-N may be substantially simultaneously patterned. Accordingly, when viewed in a cross-section, the support patterns SPP may correspond to a portion of the first cover pattern CSP-N protruded upward from a center of the pixel definition layer PDL between the second light emitting area PN-R and the third light emitting area PN-B to form a step difference.

Referring to FIG. 10B, the second area UA-P3 may include first division patterns SP1 (e.g., SP1-G, SP1-R, and SP1-B) and second cover patterns CSP-P. Details of the first division patterns SP1 (e.g., SP1-G, SP1-R, and SP1-B) are the same as those described with reference to FIG. 6D.

The second cover patterns CSP-P may be disposed on the pixel definition layer PDL. The second cover patterns CSP-P may be provided in the form of a thin layer to cover the pixel definition layer PDL.

According to an embodiment, each of fourth, fifth, and sixth sub-unit areas PU-G, PU-R, and PU-B included in the second area UA-P3 may be defined by the second cover pattern CSP-P disposed on the display opening PD-OP of the corresponding pixel definition layer PDL and the first division patterns SP1 (e.g., SP1-G, SP1-R, and SP1-B).

However, since each of the second cover patterns CSP-P may be provided in the form of a thin layer with a uniform thickness to cover the pixel definition layer PDL, fourth, fifth, and sixth light emitting areas PP-G, PP-R, and PP-B may be substantially controlled by the display opening PD-OP included in the pixel definition layer PDL.

In an embodiment, as the pixel definition layer PDL is covered by the first and second cover patterns CSP-N and CSP-P each being provided in the form of the thin layer, a strength of the pixel definition layer PDL may increase. When a durability of the pixel definition layer PDL is improved, errors in processes for the display opening PD-OP, which is included in the pixel definition layer PDL and defines the size of the light emitting areas, may be reduced, and thus, the process reliability with respect to the size of the light emitting area may be improved.

Figure 11A:
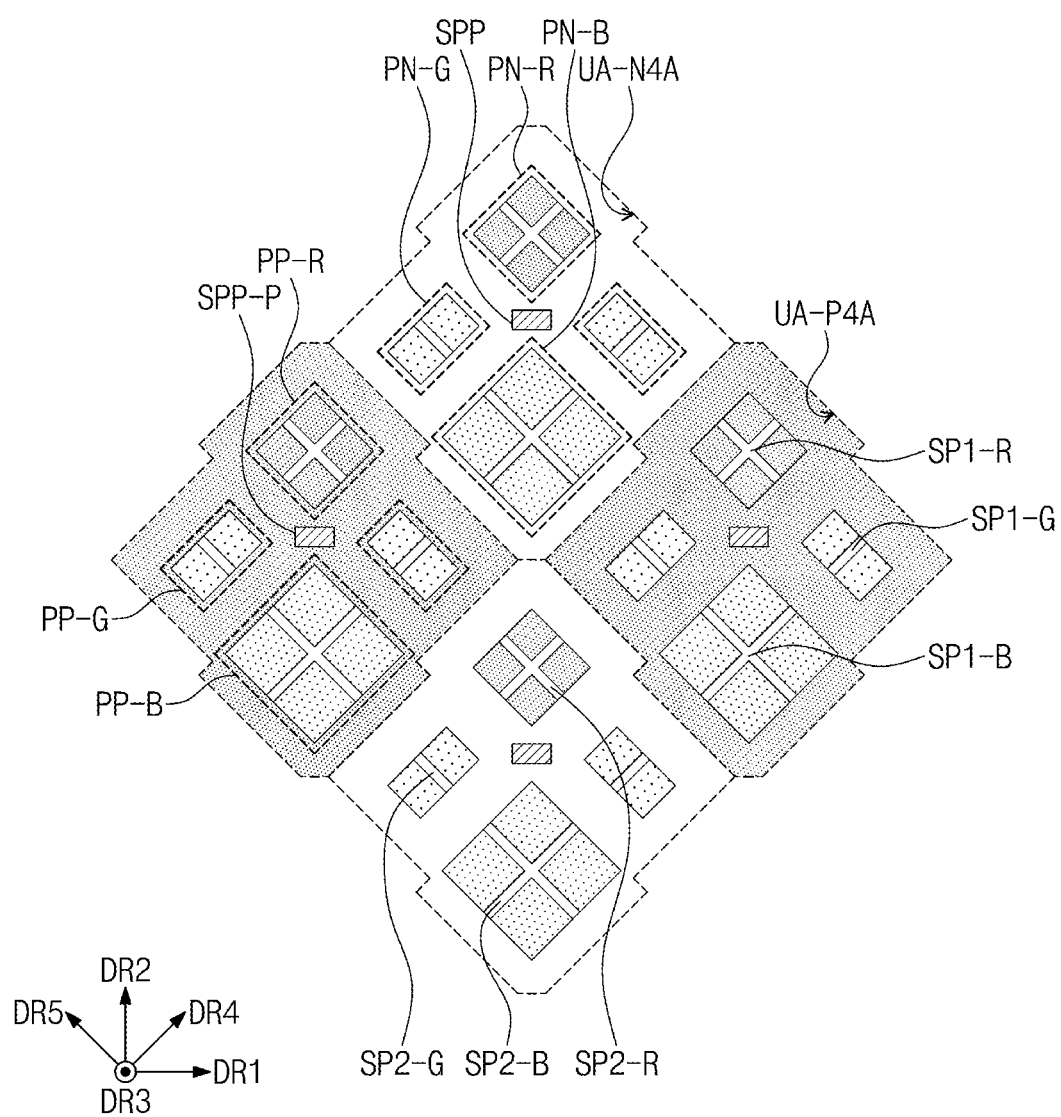
FIG. 11A is a plan view of another embodiment of the active area of the display module of FIG. 1B.
Figure 11B:
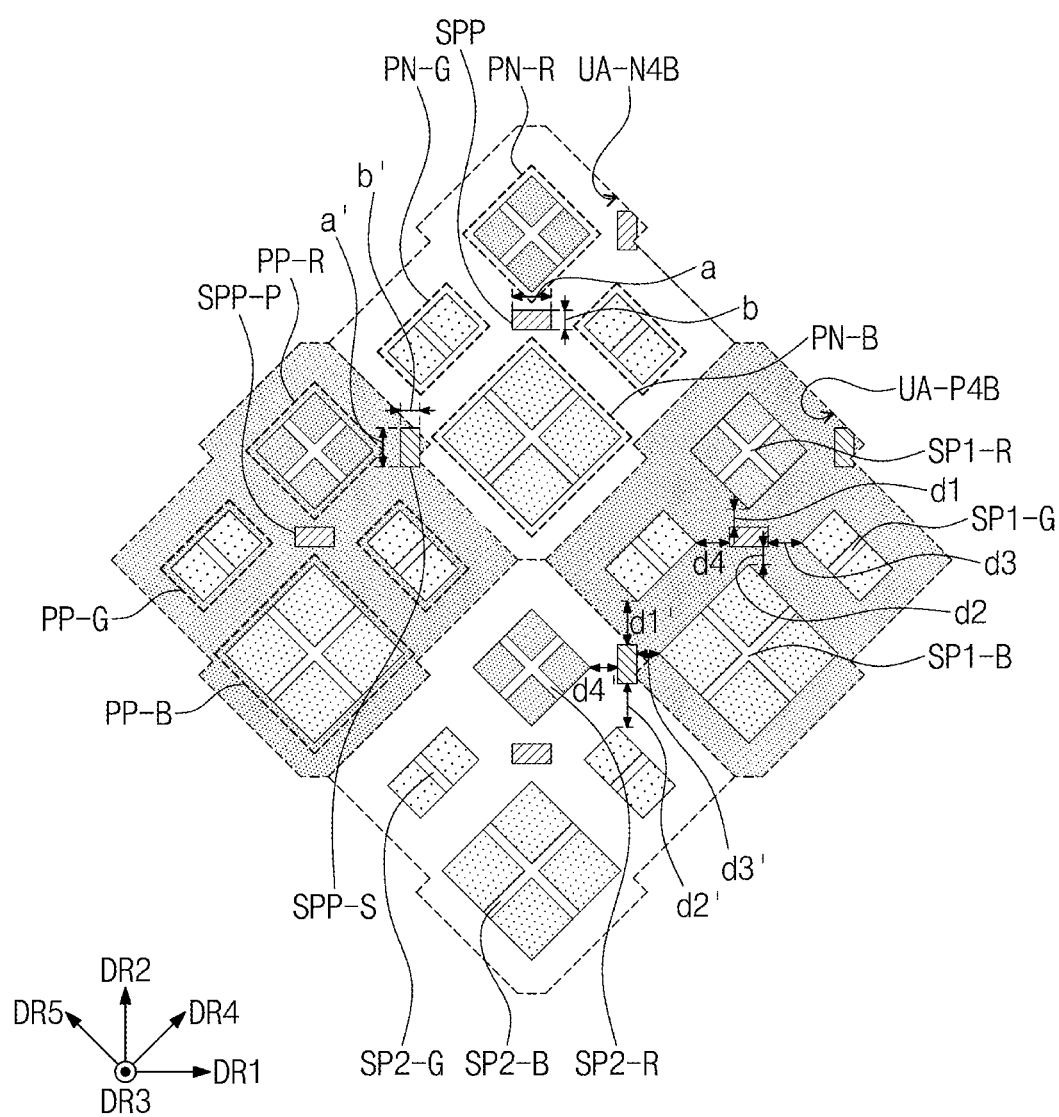
FIG. 11B is a plan view of another embodiment of the active area of the display module of FIG. 1B.

FIG. 11A is a plan view showing an active area according to an embodiment. FIG. 11B is a plan view showing an active area according to an embodiment. FIGS. 11A and 11B show examples of the active area shown in FIG. 7A according to embodiments. In FIGS. 11A and 11B, the same/similar reference numerals denote the same/similar elements in FIGS. 1 to 7C, and thus detailed descriptions of the same elements will be omitted for descriptive convenience.

Referring to FIG. 11A, a display element layer DP-OLED (refer to FIG. 4) may include support patterns SPP and additional support patterns SPP-P in the form of a second support pattern. The support patterns SPP may be disposed to overlap a first area UA-N4A, and the additional support patterns SPP-P may be disposed to overlap the second area UA-P4A.

Each of the additional support patterns SPP-P may be disposed between fourth, fifth, and sixth light emitting areas PP-G, PP-R, and PP-B of the second area UA-P4A and may be surrounded by the fourth, fifth, and sixth light emitting areas PP-G, PP-R, and PP-B. As an example, each of the additional support patterns SPP-P may be disposed between the fourth light emitting areas PP-G arranged in the first direction DR1 and may be disposed between the fifth and sixth light emitting areas PP-R and PP-B arranged in the second direction DR2.

Each of the additional support patterns SPP-P may have a rectangular shape defined by long sides extending in the first direction DR1 and short sides extending in the second direction DR2.

According to an embodiment, not only the first area UA-N4A but also the second area UA-P4A may include patterns supporting a mask, and thus, the mask may be prevented from sagging in the first and second areas UA-N4A and UA-P4A. Accordingly, a scratch caused by the sagging of the mask may be prevented from occurring on the display panel DP (refer to FIG. 1B), defects may be prevented from occurring in the display panel DP (refer to FIG. 1B), and thus, the process reliability of the display device may be improved.

FIG. 11A shows a structure in which each of the first, second, and third light emitting areas PN-G, PN-R, and PN-B of the first area UA-N4A are divided into plural sub-unit areas by second division patterns SP2 (e.g., SP2-G, SP2-R, and SP2-B), however, embodiments are not limited thereto or thereby. As an example, the additional support patterns SPP-P may be provided even when each of the first, second, and third light emitting areas PN-G, PN-R, and PN-B of the first area UA-N4A are not divided into plural sub-unit areas by separate division patterns.

Referring to FIG. 11B, a display element layer DP-OLED (refer to FIG. 4) may include support patterns SPP, additional support patterns SPP-P, and sub-support patterns SPP-S. A display module DM shown in FIG. 11B may further include the sub-support patterns SPP-S when compared with a display module DM (refer to FIG. 1B) shown in FIG. 11A.

The support patterns SPP may be disposed to overlap a first area UA-N4B, and the additional support patterns SPP-P may be disposed to overlap a second area UA-P4B. According to an embodiment, the sub-support patterns SPP-S may be disposed near a boundary between the first and second areas UA-N4B and UA-P4B.

As an example, some of the sub-support patterns SPP-S may be disposed between a third light emitting area PN-B of the first area UA-N4B and a fifth light emitting area PP-R of the second area UA-P4B, which is spaced apart from the third light emitting area PN-B in the first direction DR1, and may be disposed between a first light emitting area PN-G of the first area UA-N4B and a fourth light emitting area PP-G of the second area UA-P4B, which is spaced apart from the first light emitting area PN-G in the second direction DR2. For example, the other of the sub-support patterns SPP-S may be disposed between a sixth light emitting area PP-B of the second area UA-P4B and a second light emitting area PN-R of the first area UA-N4B, which is spaced apart from the sixth light emitting area PP-B in the first direction DR1, and may be disposed between a first light emitting area PN-G of the first area UA-N4B and the fourth light emitting area PP-G of the second area UA-P4B, which is spaced apart from the first light emitting area PN-G in the second direction DR2.

For example, some of the sub-support patterns SPP-S may be surrounded by the first and third light emitting areas PN-G and PN-B of the first area UA-N4B and the fourth and fifth light emitting areas PP-G and PP-R of the second area UA-P4B adjacent to the first and third light emitting areas PN-G and PN-B of the first area UA-N4B. In addition, the other of the sub-support patterns SPP-S may be surrounded by the first and second light emitting areas PN-G and PN-R of the first area UA-N4B and the fourth and sixth light emitting areas PP-G and PP-B of the second area UA-P4B adjacent to the first and second light emitting areas PN-G and PN-R of the first area UA-N4B.

Each of the sub-support patterns SPP-S may have a rectangular shape defined by long sides extending in the second direction DR2 and short sides extending in the first direction DR1.

Each of the support patterns SPP may include first long sides a extending in the first direction DR1 and first short sides b extending in the second direction DR2. According to an embodiment, the first long sides a may have a length equal to or greater than about 5 micrometers and equal to or smaller than about 30 micrometers. The first short sides b may have a length equal to or greater than about 3 micrometers and equal to or smaller than about 20 micrometers.

In a case where the length of the first long side a of the support patterns SPP is smaller than about 5 micrometers or the length of the first short side b of the support patterns SPP is smaller than about 3 micrometers, the support patterns SPP may not sufficiently support the mask, and thus, the mask may be sagged downward. In a case where the length of the first long side a of the support patterns SPP is greater than about 30 micrometers or the length of the first short side b of the support patterns SPP is greater than about 20 micrometers, the support patterns SPP may cover a portion of the light emitting area.

According to an embodiment, the additional support patterns SPP-P may have substantially the same width as that of the support patterns SPP. For example, a length of long sides extending in the first direction DR1 of each of the additional support patterns SPP-P may be equal to or greater than about 5 micrometers and equal to or smaller than about 30 micrometers, and a length of the short sides extending in the second direction DR2 of each of the additional support patterns SPP-P may be equal to or greater than about 3 micrometers and equal to or smaller than about 20 micrometers.

In an embodiment, each of the sub-support patterns SPP-S may include second long sides a' extending in the second direction DR2 and second short sides b' extending in the first direction DR1. According to an embodiment, a length of the second long sides a' may be equal to or greater than about 5 micrometers and equal to or smaller than about 30 micrometers. A length of the second short sides b' may be equal to or greater than about 3 micrometers and equal to or smaller than about 15 micrometers.

According to an embodiment, the second long sides a' of the sub-support patterns SPP-S may have substantially the same length as that of the first long sides a of the support patterns SPP, and the second short sides b' of the sub-support patterns SPP-S may have substantially the same length as that of the first short sides b of the support patterns SPP.

However, embodiments are not limited thereto or thereby. According to an embodiment, the second long sides a' of the sub-support patterns SPP-S may be smaller than the first long sides a of the support patterns SPP, and the second short sides b' of the sub-support patterns SPP-S may be smaller than the first short sides b of the support patterns SPP.

In an embodiment, a ratio of the area occupied by the support patterns SPP, the additional support patterns SPP-P, and the sub-support patterns SPP-S with respect to a total area of the display panel DP (refer to FIG. 1A) may be equal to or greater than about 0.5% and equal to or smaller than about 10%. In particular, the ratio of the area may be equal to or greater than about 1.0% and equal to or smaller than about 3.0%.

In an embodiment, a minimum separation distance between the fifth light emitting area PP-R and the first long side a of one support pattern SPP in the second direction DR2 may be referred to as a first distance d1. For example, a minimum separation distance between the sixth light emitting area PP-B spaced and the first long side a of the one support pattern SPP in the second direction DR2 may be referred to as a second distance d2. According to an embodiment, the first and second distances d1 and d2 may be substantially the same as each other.

For example, a minimum separation distance between the fourth light emitting areas PP-G (e.g., at the right side) and the first short side b of the support pattern SPP in the first direction DR1 may be referred to as a third distance d3. For example, a minimum separation distance between the fourth light emitting areas PP-G (e.g., at the left side) and the first short side b of the support pattern SPP in the first direction DR1 may be referred to as a fourth distance d4. According to an embodiment, the third and fourth distances d3 and d4 may be substantially the same as each other.

According to an embodiment, each of the first, second, third, and fourth distances d1, d2, d3, and d4 may be equal to or greater than about 3 micrometers and equal to or smaller than about 15 micrometers. In this case, each of the first and second distances d1 and d2 may be smaller than the third and fourth distances d3 and d4.

In an embodiment, a minimum separation distance between the second short sides b' of one sub-support pattern SPP-S and the fourth light emitting area PP-G of the second area UA-P4B, which are spaced apart from the second short sides b' in the second direction DR2, may be referred to as a first' distance d1'. For example, a minimum separation distance between the second short sides b' of the one sub-support pattern SPP-S and the first light is emitting area PN-G of the first area UA-N4B may be referred to as a second' distance d2'. According to an embodiment, the first' and second' distances d1' and d2' may be substantially the same as each other.

For example, a minimum separation distance between the second long sides a' of the one sub-support pattern SPP-S and the sixth light emitting area PP-B of the second area UA-P4B may be referred to as a third' distance d3'. For example, a minimum separation distance between the second long sides a' of the one sub-support pattern SPP-S and the second light emitting area PN-R of the first area UA-N4B may be referred to as a fourth' distance d4'. According to an embodiment, the third' and fourth' distances d3' and d4' may be substantially the same as each other.

According to an embodiment, each of the first', second', third', and fourth' distances d1', d2', d3', and d4' may be equal to or greater than about 3 micrometers and equal to smaller than about 15 micrometers. In this case, each of the first' and second' distances d1' and d2' may be greater than the third' and fourth' distances d3' and d4'.

According to an embodiment, the patterns supporting the mask may be formed between the first area UA-N4B and the second area UA-P4B, and thus, the sagging of the mask may be reduced. Accordingly, the scratch caused by the mask on the display panel DP may be reduced, and the process reliability of the display panel DP may be improved.

FIG. 11B shows the active area to which the sub-support patterns SPP-S are applied, however, embodiments are not limited thereto or thereby. As an example, the sub-support patterns SPP-S may be disposed in the display modules DM shown in FIGS. 6A, 8A, and 9A.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a circuit element layer comprising at least one transistor; and
a display element layer disposed on the circuit element layer, the display element layer comprising:
a first area comprising first, second, and third light emitting areas and a first non-light emitting area; and
a second area comprising fourth, fifth, and sixth light emitting areas and a second non-light emitting area,
wherein the display element layer comprises:
a first light emitting element to provide a first light to each of the first light emitting area and the fourth light emitting area;
a second light emitting element to provide a second light to each of the second light emitting area and the fifth emitting area;
a third light emitting element to provide a third light to each of the third light emitting area and the sixth emitting area;
a pixel definition layer having openings defined therethrough to overlap the first, second, third, fourth, fifth, and sixth light emitting areas, respectively; and
a first division pattern disposed in at least some of the openings, and wherein:
each of the fourth, fifth, and sixth light emitting areas of the second area comprises a plurality of sub-unit areas,
the first division pattern overlaps the second area and divides each of the fourth, fifth, and sixth light emitting areas of the second area into the plurality of sub-unit areas,
the second non-light emitting area of the second area comprises a first sub-non-light-emitting area surrounding the fourth, fifth, and sixth light emitting areas and a second sub-non-light-emitting area surrounded by the plurality of sub-unit areas of each of the fourth, fifth, and sixth light emitting areas and the first sub-non-light-emitting area, and
the pixel definition layer overlaps the first non-light emitting area of the first area and the first sub-non-light-emitting area of the second area and has a transmittance different from a transmittance of the first division pattern,
the display element layer comprises a first support pattern disposed on the pixel definition layer and surrounded by the first, second, and third light emitting areas of the first area or a second support member disposed on the pixel definition layer and surrounded by the fourth, fifth, and sixth light emitting areas of the second area, and
the first and second support patterns and the first division pattern comprise one of a polymer material and a silicon.

2. The display device of claim 1, wherein the pixel definition layer comprises an organic layer comprising a light blocking material.

3. The display device of claim 1, wherein:
the second light emitting area has a size greater than a size of the first light emitting area and smaller than a size of the third light emitting area in the first area, and
the fifth light emitting area has a size greater than a size of the fourth light emitting area and smaller than a size of the sixth light emitting area in the second area.

4. The display device of claim 3, wherein the plurality of sub-unit areas comprise fourth sub-unit areas included in the fourth light emitting area, fifth sub-unit areas included in the fifth light emitting area, and sixth sub-unit areas included in the sixth light emitting area in the second area.

5. The display device of claim 4, wherein the fourth sub-unit areas have a same width as each other in one direction in the second area, the fifth sub-unit areas have the same width as each other in the one direction in the second area, and the sixth sub-unit areas have the same width as each other in the one direction in the second area.

6. The display device of claim 1, wherein each of the first, second, and third light emitting elements comprises a first electrode, a second electrode disposed on the first electrode, and a light emitting layer disposed between the first electrode and the second electrode, each of the openings of the pixel definition layer exposes at least a portion of the first electrode, and the first division pattern is disposed on the first electrode exposed through the openings.

7. The display device of claim 6, wherein each of the first, second, and third light emitting areas of the first area comprises a plurality of other sub-unit areas, the plurality of other sub-unit areas comprising first sub-unit areas included in the first light emitting area, second sub-unit areas included in the second light emitting area, and third sub-unit areas included in the third light emitting area.

8. The display device of claim 7, further comprising a second division pattern overlapping the first area, disposed on the first electrode exposed through the openings, and comprising a same material as the first division pattern, wherein the first, second, and third sub-unit areas of the first area are defined by the second division pattern.

9. The display device of claim 8, wherein the plurality of sub-unit areas comprise fourth sub-unit areas included in the fourth light emitting area, fifth sub-unit areas included in the fifth light emitting area, and sixth sub-unit areas included in the sixth light emitting area in the second area, and
wherein a sum of sizes of the first sub-unit areas of the first area is substantially equal to a sum of sizes of the fourth sub-unit areas of the second area, a sum of sizes of the second sub-unit areas of the first area is substantially equal to a sum of sizes of the fifth sub-unit areas of the second area, and a sum of sizes of the third sub-unit areas of the first area is substantially equal to a sum of sizes of the sixth sub-unit areas of the second area.

10. The display device of claim 8, further comprising:
at least one insulating layer disposed on the display element layer;

a first planarization layer disposed on the at least one insulating layer;

a light blocking pattern disposed on the first planarization layer; and a second planarization layer disposed on the first planarization layer and covering the light blocking pattern, wherein the light blocking pattern is disposed on the pixel definition layer and the first division pattern disposed in the second area and does not overlap the second division pattern in the first area.

11. The display device of claim 6, wherein the first non-light emitting area comprises a first peripheral area surrounding the first, second, and third light emitting areas, a first center area surrounded by the first, second, and third light emitting areas and the first peripheral area in the first area, and wherein the display element layer further comprises a first center division pattern disposed to overlap the first center area and formed of a same material as the first division pattern in the first area.

12. The display device of claim 11, wherein the first sub-non-light-emitting area comprises a second peripheral area surrounding the fourth, fifth, and sixth light emitting areas and a second center area surrounded by the fourth, fifth, and sixth light emitting areas and the second peripheral area in the second area, and wherein the display element layer further comprises a second center division pattern disposed to overlap the second center area and formed of a same material as the first division pattern.

13. The display device of claim 12, wherein each of the first, second, and third light emitting areas comprises a plurality of other sub-unit areas in the first area, the display element layer further comprises a second division pattern overlapping the first area and disposed on the first electrode exposed through the openings, and the plurality of other sub-unit areas of the first area are defined by the second division pattern.

14. The display device of claim 1, wherein: the first light emitting area is provided in two in the first area, the two first light emitting areas are arranged in a first direction, the second light emitting area and the third light emitting area are spaced apart from each other in a second direction intersecting the first direction, the first support pattern is disposed between the two first light emitting areas and is disposed between the second and third light emitting areas, the fourth light emitting area is provided in two in the second area, the two fourth light emitting areas are arranged in the first direction, the fifth light emitting area and the sixth light emitting area are spaced apart from each other in the second direction in the second area, and the second support pattern is disposed between the two fourth light emitting areas and is disposed between the fifth and sixth light emitting areas.

15. The display device of claim 14, wherein each of the first and second support patterns has a rectangular shape defined by first long sides extending in the first direction and first short sides extending in the second direction, the first long sides have a length equal to or greater than about 5 micrometers and equal to or smaller than about 30 micrometers, and the first short sides have a length equal to or greater than about 3 micrometers and equal to or smaller than about 20 micrometers.

16. The display device of claim 14, wherein the display element layer further comprises a plurality of sub-support patterns, and wherein:

one of the plurality of sub-support patterns is disposed between the first light emitting area of the first area and the fourth light emitting area of the second area in the second direction and disposed between the third light emitting area of the first area and the fifth light emitting area of the second area in the first direction, and another of the plurality of sub-support patterns is disposed between the first light emitting area of the first area and the fourth light emitting area of the second area in the second direction and disposed between the second light emitting area of the first area and the sixth light emitting area of the second area in the first direction.

17. The display device of claim 16, wherein each of the plurality of sub-support patterns has a rectangular shape defined by second long sides extending in the second direction and second short sides extending in the first direction, the second long sides have a length equal to or greater than about 5 micrometers and equal to or smaller than about 30 micrometers, and the second short sides have a length equal to or greater than about 3 micrometers and equal to or smaller than about 15 micrometers.

18. The display device of claim 16, wherein a separation distance from each of the first and second support patterns and the plurality of sub-support patterns to the first, second, third, fourth, fifth, and sixth light emitting areas most adjacent thereto is equal to or greater than about 3 micrometers and equal to or smaller than about 15 micrometers.

19. The display device of claim 1, wherein:

in a first operation mode, the first, second, and third light emitting areas of the first area are activated, and the fourth, fifth, and sixth light emitting areas of the second area are activated, and in a second operation mode, the first, second, and third light emitting areas of the first area are inactivated, and the fourth, fifth, and sixth light emitting areas of the second area are activated.

* * * * *